(12) United States Patent
Lu et al.

(10) Patent No.: US 12,300,990 B2
(45) Date of Patent: May 13, 2025

(54) ACTIVE SNUBBERS FOR SOLID STATE CIRCUIT BREAKERS TO IMPROVE SWITCH VOLTAGE UTILIZATION RATE

(71) Applicant: Drexel University, Philadelphia, PA (US)

(72) Inventors: Fei Lu, Wynnewood, PA (US); Hua Zhang, Philadelphia, PA (US); Reza Kheirollahi, Philadelphia, PA (US)

(73) Assignees: Drexel University, Philadelphia, PA (US); Lehigh University, Bethlehem, PA (US)

( * ) Notice: Subject to any disclaimer, the term of this patent is extended or adjusted under 35 U.S.C. 154(b) by 76 days.

(21) Appl. No.: 18/058,447

(22) Filed: Nov. 23, 2022

(65) Prior Publication Data
US 2023/0163587 A1 May 25, 2023

Related U.S. Application Data

(60) Provisional application No. 63/299,552, filed on Jan. 14, 2022, provisional application No. 63/282,360, filed on Nov. 23, 2021.

(51) Int. Cl.
*H02H 3/087* (2006.01)
*H01C 7/108* (2006.01)
(Continued)

(52) U.S. Cl.
CPC ............ *H02H 3/087* (2013.01); *H01C 7/108* (2013.01); *H01H 9/16* (2013.01); *H01H 9/542* (2013.01);
(Continued)

(58) Field of Classification Search
CPC ........... H03K 17/687; H03K 17/08142; H03K 17/102; H03K 2217/0009; H02H 3/087;
(Continued)

(56) References Cited

U.S. PATENT DOCUMENTS

| 2018/0019583 A1* | 1/2018 | Dupraz | H01H 9/542 |
| 2020/0152407 A1* | 5/2020 | Askan | H01H 9/542 |
| 2022/0165524 A1* | 5/2022 | Grieshaber | H01H 9/542 |

OTHER PUBLICATIONS

Kheirollahi et al., "Novel Active Snubbers for SSCBs to Improve Switch Voltage Utilization Rate," IEEE Journal of Emerging and Selected Topics in Power Electronics, downloaded Jan. 31, 2023, 12 pages.

(Continued)

*Primary Examiner* — Kevin J Comber
(74) *Attorney, Agent, or Firm* — Schott, P.C.

(57) ABSTRACT

There may be two active snubbers for direct current (dc) solid-state circuit breakers (SSCBs): metal-oxide-varistor with resistor-capacitor-switch (MOV-RCS) and active-MOV with resistor-capacitor-diode (AMOV-RCD). In the snubber branch, either half- or full-controlled switch can be used, leading to four topologies. The improved snubbers offer several improvements: 1) MOV is disconnected from the power line during SSCB OFF-state, which enhances reliability as neither voltage nor power appears on MOV; 2) voltage utilization rate ηv of the main switch is remarkably increased, which improves efficiency and power density, and reduces design cost shows experiments of five prototypes are conducted including four proposed snubbers and a comparison with conventional MOV-RCD snubber.

7 Claims, 23 Drawing Sheets

(51) Int. Cl.
*H01H 9/16* (2006.01)
*H01H 9/54* (2006.01)
*H03K 17/687* (2006.01)

(52) U.S. Cl.
CPC ..... *H03K 17/687* (2013.01); *H01H 2009/543* (2013.01)

(58) Field of Classification Search
CPC .... H01H 9/542; H01H 9/16; H01H 2009/543; H01C 7/108
USPC ....................................................... 361/93.1
See application file for complete search history.

(56) References Cited

OTHER PUBLICATIONS

Lui et al., "A Novel Solid-State Switch Scheme With High Voltage Utilization Efficiency by Using Modular Gapped MOV for DC Breakers," IEEE Transactions on Power Electronics, vol. 37, No. 3, Mar. 2022, 2502-2507.
Ravi et al., "Electronic MOV-Based Voltage Clamping Circuit for DC Solid-State Circuit Breaker Applications," IEEE Transactions On Power Electronics, vol. 37, No. 7 Jul. 2022, 7561-7565.

* cited by examiner

TABLE I.
VOLTAGE AND CURRENT STRESS ON CIRCUIT COMPONENTS

*MOV-RCS based SSCB and AMOV-RCD based SSCB*

| Comp. | $S_m$ | $S_z$ | $C_z$ | $R_z$ ($R_{z2}$) | MOV | $R_{z1}$ |
|---|---|---|---|---|---|---|
| $v_{Peak}^{(1)}$ | $V_{Clamp}$ | $V_{dc}$ | $V_{Clamp}$ | $V_{Clamp}$ | $V_{Clamp}$ | $R_{z1} \times I_{max}$ |
| $i_{Peak}^{(2)}$ | $I_{dc}$ | $I_{max}^{(3)}$ | $I_{max}$ | $V_{Clamp}/R_z$ | $I_{max}$ | $I_{max}$ |

FIG. 41

TABLE II.
COST ANALYSIS FOR $I_{DC}$=100 A AND EFFICIENCY=99.97%.

| DC Link Voltage $V_{dk}$ | | | 500 V | 2 kV | 4 kV | 10 kV |
|---|---|---|---|---|---|---|
| MOV-RCS AMOV-RCD $\eta_s$=60% | $S_z$ is a MOSFET | $S_m^{(1)}$ | 1×14$^{(2)}$ | 3×10 | 6×10 | 1×10 |
| | | $S_z^{(1)}$ | 1×2 | 2×2 | 4×2 | 9×2 |
| | | Total | 16 | 34 | 68 | 158 |
| | $S_z$ is a thyristor | $S_m^{(1)}$ | 1×14 | 3×10 | 6×10 | 14×10 |
| | | $S_z^{(3)}$ | 1 | 2 | 3 | 7 |
| | | Total | 15 | 32 | 63 | 147 |
| MOV-RCD $\eta_s$=37.5% | | $S_m^{(1)}$ | 1×14 | 5×17 | 9×15 | 23×16 |
| | | Total | 14 | 85 | 135 | 368 |

(1) C3M0016120D SiC MOSFET; (2) Ns×Np (series×parallel); (3) SK655KD thyristor.

FIG. 42

TABLE III.
PARAMETERS OF DC TEST CIRCUIT, CONVENTIONAL MOV-RCD BASED SSCB, AND THE ACTIVE SNUBBERS BASED SSCBS.

| $V_{dk}$ | 450 V (720 V) | $L_{line}$ | 40 μH |
|---|---|---|---|
| $S_m$ | C3M0016120D | $S_z$ (MOSFET) | C3M0016120D |
| $R_{z1}$ | 50 Ω | $S_z$ (Thyristor) | SK655KD |
| $C_z$ | 300 nF | $D_z$ | C4D20120D |
| MOV$^{(1)}$ | V420LA40BP | $R_z$ ($R_{z2}$) | 10 kΩ |

(1) with MOV dc rating of 360 V and clamping voltage of 1060 V.

FIG. 43

ACTIVE SNUBBERS FOR SOLID STATE CIRCUIT BREAKERS TO IMPROVE SWITCH VOLTAGE UTILIZATION RATE

STATEMENT REGARDING GOVERNMENT SUPPORT

This invention was made with government support under Contract No. DE-AR0001114 awarded by the Advanced Research Projects Agency-Energy (ARPA-E), U.S. Department of Energy. The government has certain rights in the invention.

BACKGROUND

I. Introduction

Solid-state circuit breakers (SSCBs) have ultrafast response time and bring advantages in terms of modularity and power density. To interrupt DC currents, metal-oxide-varistors (MOVs) are commonly used, which dissipate the residual inductive energy and clamp voltage oscillations. However, MOVs bring two practical challenges. First, MOV degradation creates a reliability issue. An MOV degrades as the number and duration of surge currents increase. As MOV degrades, the size of metal oxide (ZnO) grain is reduced, and the lattice parameters change. It is explained by non-uniform distribution of temperature in the material due to the growth of localized hotspots during surge currents. In this case, leakage current rises which could cause failures.

FIG. 1 shows MOV failure in SSCBs, where V1 mA is MOV voltage with 1 mA leakage current. As leakage current rises with degradation, power consumption and temperature both increase. As the MOV heats up, its leakage current keeps rising, resulting in a positive feedback. If the temperature exceeds its capability, thermal runaway happens.

To address the reliability issue, solutions have been studied. A thermal fuse is connected in series, named TMOV. It prevents short circuits but significantly elongates reclosing process. A mechanical contactor can disconnect the MOV from the power line during OFF-state, but the low speed remains unresolved. In some prior art, 20% margin is suggested to select Vdc,MOV (dc bus voltage on MOV with extremely low leakage current); however, it leads to dimensioning issues. Although the reported methods are useful, but more effective solutions are needed to cut the problem at its root.

As the second problem of MOV, the voltage utilization rate of the main solid-state switch $\eta v$ is significantly impacted. $\eta v$ is an important parameter to evaluate SSCBs defined as below.

$$\eta v = (\text{DC bus voltage/Switch voltage rating}) \times 100\% \quad (\text{EQ. 1})$$

In MOV-based snubbers, Vdc,MOV must be higher than the DC bus voltage to reduce leakage currents. Also, voltage rating of the main switch must be higher than the MOV clamping voltage VClamp. So, $\eta v$ is significantly reduced, leading to two practical difficulties:

(1) It impacts the breaker efficiency and increases the design cost since the number of series-connected solid-state switches in the main branch increases to hold VClamp.

(2) The power density is decreased due to the high voltage components in the main and snubber branches.

Regarding the reported DC circuit breakers (DCCBs) in academia and industry, the switch voltage utilization rate $\eta v$ mostly falls below 50%, highlighting the significance of the research in this filed.

Although the MOV reliability issue can be avoided to some degree during the design procedure by leaving safe margins in handling surge currents, it potentially reduces fly in SSCBs.

SUMMARY OF THE EMBODIMENTS

To solve the MOV reliability issue and maximize $\eta v$ in SSCBs at the same time, four new active snubbers are introduced for SSCBs as follows:

(1) MOV with resistor-capacitor-switch (MOV-RCS) using full-controlled switches.

(2) MOV-RCS with half-controlled switches.

(3) Active-MOV with resistor-capacitor-diode (AMOV-RCD) using full-controlled switches.

(4) AMOV-RCD with half-controlled switches.

The proposed active snubbers are extended to bidirectional topologies, resulting in four novel bidirectional active snubbers for SSCBs. In addition to illustrating the circuit analysis and working principle, the design procedure, the operating speed, the MOV energy absorption, and the switch voltage utilization rate of the proposed active snubbers are deeply analyzed. Compared with the conventional passive MOV-RCD snubber, the proposed active snubbers benefit from the following advantages in SSCBs: 1) efficiency improvement; 2) power density enhancement; 3) design cost reduction; and 4) reliability improvement. All these factors are demonstrated in section V.

To validate the presented active snubbers, five SSCB prototypes, including conventional MOV-RCD snubber, are implemented and tested under the DC bus voltage up to 720 V, resulting in 33 sets of experiments. The results show $\eta v$ is enhanced from 37.5% to 60%, meaning 160% improvement. Also, neither voltage nor power appears on MOV when SSCB is OFF, which addresses MOV reliability issue and prevents short circuit failure during the SSCB OFF-state.

BRIEF DESCRIPTION OF THE DRAWINGS

FIG. 2(a) shows unidirectional and FIG. 2(b) shows bidirectional.

FIG. 3(a) shows unidirectional and FIG. 3(b) shows bidirectional.

FIG. 4(a) shows unidirectional and FIG. 4(b) bidirectional.

FIG. 5(a) shows unidirectional and FIG. 5(b) shows bidirectional.

FIGS. 15(a) and 15(b) show a comparison between the proposed active snubbers and the conventional MOV-RCD in terms of: FIG. 15(a) efficiency improvement, FIG. 15(b) power density enhancement with respect to the prototypes in FIG. 16, and FIG. 15(c) cost reduction regarding FIG. 42, Table II. The cost comparison is solely based on the number of solid-state switches in active MOV-RCS and passive MOV-RCD snubbers.

FIG. 41 shows Table I.

FIG. 42 shows Table II.

FIG. 43 shows Table III.

DETAILED DESCRIPTION OF THE EMBODIMENTS

II. Proposed MOV-RCS and AMOV-RCD Based SSCBS

A. Circuit Topologies

Figure 1:
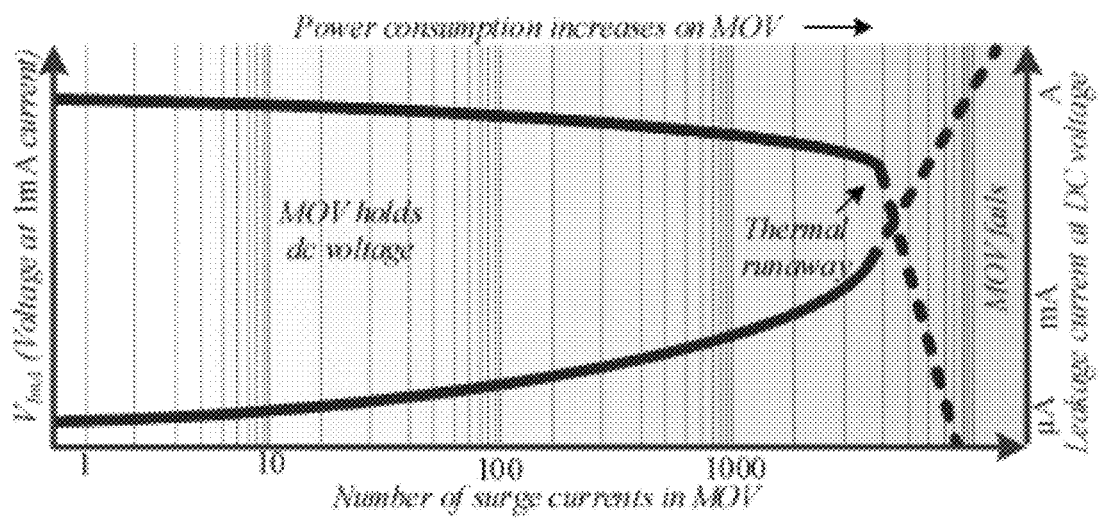
FIG. 1 shows a conceptual view of MOV failure in SSCBs.
Figures 2A, 2B:
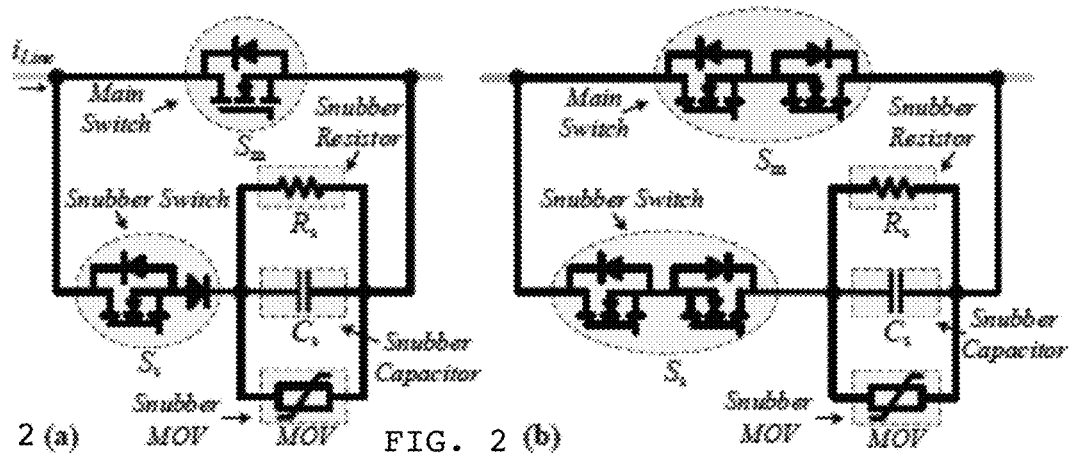
FIGS. 2(a) and 2(b) show MOV-RCS based SSCB; Ss is a full-controlled switch.
Figure 3:
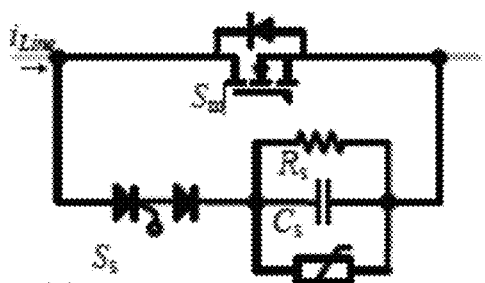
FIGS. 3(a) and 3(b) show MOV-RCS based SSCB; Ss is a half-controlled switch.
Figure 3:
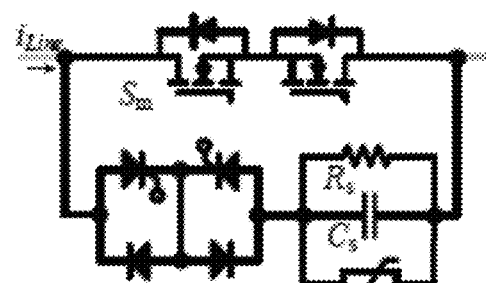

FIGS. 2(a) and 2(b) show unidirectional and bidirectional topologies of the proposed MOV-RCS based SSCBs. A MOSFET is in series with a diode to form Ss with complete control during ON/OFF. Meanwhile, the MOSFET in Ss can be replaced by a thyristor. FIGS. 3(a) and 3(b) show the modified MOV-RCS based SSCBs. Using the diode in series with the thyristor helps to eliminate the reverse recovery current of the thyristor.

FIG. 4(a) shows the proposed AMOV-RCD based SSCB benefiting from a conventional RCD circuit. It can be extended to a bidirectional structure as in FIG. 4(b). Similarly, the MOSFET in Ss can be replaced by a thyristor, where the extended topologies are indicated in FIGS. 5(a) and 5(b).

B. Working Principles and Electrical Waveforms

B.1. MOV-RCS Based SSCB

Figure 6:
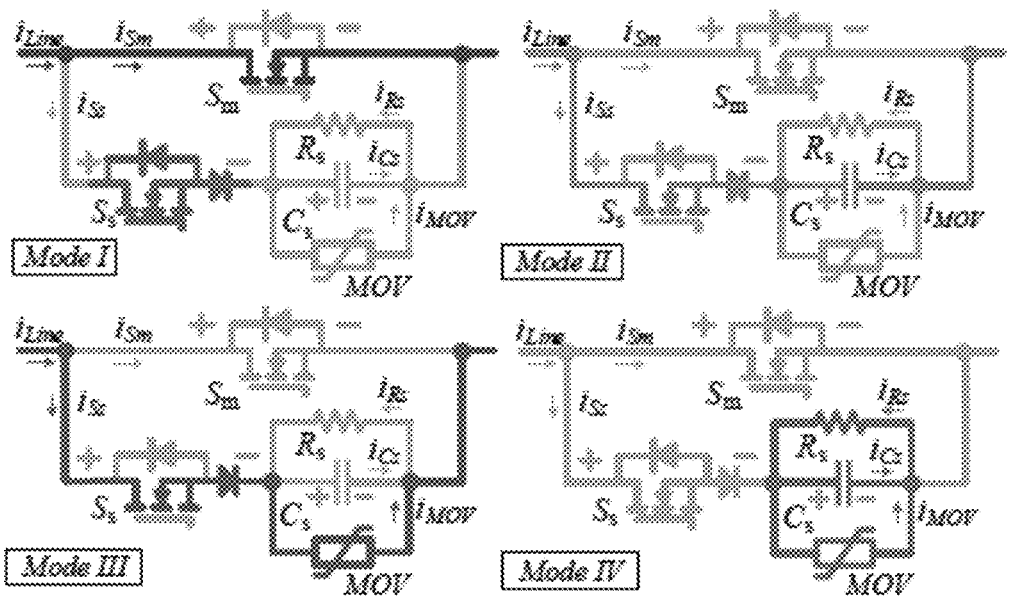
FIG. 6 shows operating modes of MOV-RCS based SSCB. Ss is a full-controlled switch.
Figure 7:
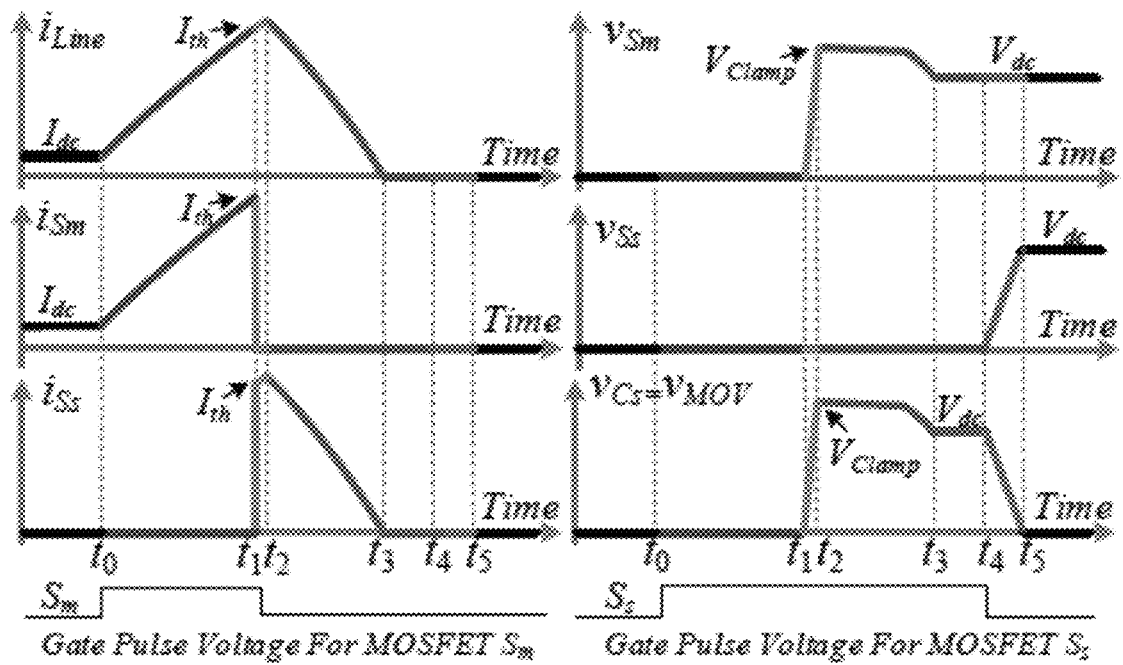
FIG. 7 shows critical waveforms of MOV-RCS based SSCB. Ss is a full-controlled switch.

For an MOV-RCS based SSCB in FIG. 2(a), the working principle and critical waveforms are shown in FIGS. 6 and 7.

Before t0: SSCB conducts load current (Idc), Sm and Ss are ON.

Mode I ($t0 \leq t < t1$): A short circuit fault occurs at t=t0.

Mode II ($t1 \leq t < t2$): Fault current reaches threshold Ith at t=t1; Sm turns off, so current commutates to Ss, and charges Cs.

Mode III ($t2 \leq t < t4$): When Cs reaches VClamp, the MOV turns on and absorbs the stored inductive energy of the system inductance LLine. During this time interval, the MOV clamps the voltage across the breaker to VClamp regardless of the system inductance LLine. As VClamp>Vdc, the system current idc reduces to zero with the rate of didc/dt=−((VClamp−Vdc)/LLine). At t=t3, the system current reduces to iSs=iMOV+(Vdc/Rs), where iMOV is the MOV leakage current under the DC bus voltage Vdc.

Mode IV ($t4 \leq t < t5$): Ss turns off at t=t4; as Rs≤10 kΩ, voltage on Ss begins rising; while the voltage on Cs and MOV reduces at the same time, reaching zero at t=t5; interruption completes.

B.2. AMOV-RCD Based SSCB

Figure 8:
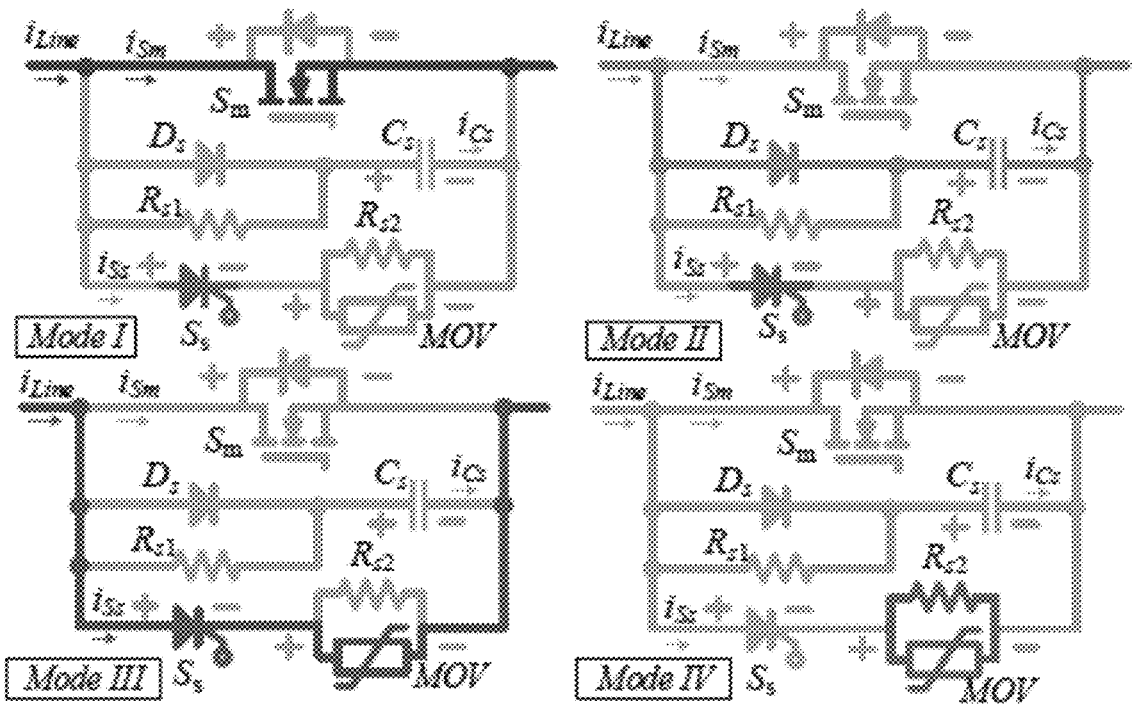
FIG. 8 shows operating modes of AMOV-RCD based SSCB. Ss is a half-controlled switch.
Figure 9:
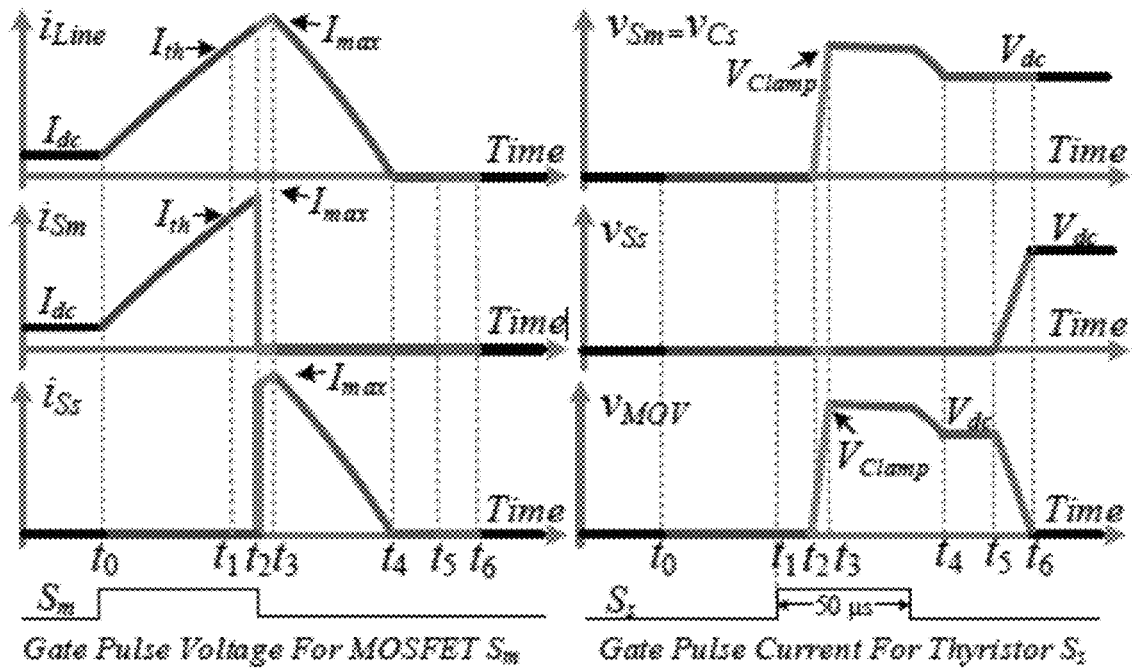
FIG. 9 shows critical waveforms of AMOV-RCD SSCB. Ss is a half-controlled switch.

FIGS. 8 and 9 display operating modes and waveforms of an AMOV-RCD based SSCB, and they are explained below.

Before t0: Idc flows through SSCB; Sm is ON, and Ss is OFF.

Mode I ($t0 \leq t < t2$): A fault occurs at t=t0. As iLine=Ith at t=t1, Ss is triggered, and it is completely ON at t=t2. To turn Ss ON, a pulse current with the duration of 50 µs is injected into the gate-cathode terminal of Ss. This pulse current keeps Ss ON during commutating the fault current from Sm to Ss; the gate pulse current waveform is shown in FIG. 9.

Mode II (t2≤t<t3): Sm turns off at t=t2; DC current commutates to Ds, and charges Cs.

Mode III (t3≤t<t5): vCs=VClamp at t=t3; MOV turns on and conducts the current (iLine=iSs=iMOV); t2–t1 defines the reaction time interval; Current reduces to iSs=iMOV+Vdc/Rs2 at t=t4.

Mode IV (t5t<t6): As iSs reduces below the holding current of Ss (IH), it turns off naturally at t=t5; vMOV begins decaying to zero, and vSs increases to Vdc; interruption completes at t=t6.

C. Voltage/Current Stress on Circuit Components

Regarding the working principle and waveforms, the voltage (vPeak) and current (iPeak) peaks on the components are derived in FIG. 41, Table I. It is noted that, in contrast to the main switch Sm, the maximum voltage on the snubber switch Ss is limited to Vdc, and Ss does not need to tolerate the peak voltage of VClamp.

Although the snubber switch Ss handles Imax during the current interruption, the duration of the pulse current is typically limited to tens to hundreds of microseconds. In this case, the increase of junction temperature is limited to the die and the case temperature is not significantly affected. Therefore, the prompt temperature rise inside the snubber switch should be considered in conducting the pulse currents during the operation, and the need for cooling systems is mitigated for Ss. While, the main switch Sm may use a proper cooling system during steady-state operation which will be satisfied using heat sinks in this device.

III. Proposed Design Procedures

A. MOV-RCS Based SSCB, Components Selection

A.1. Selecting Cs

The design objective of Cs is to reduce dvSm/dt during current interruption. Regarding mode II and interval t1≤t<t2 in FIGS. 6 and 7, iCs≈Ith, and Cs is approximated as (2) where trising=t2–t1. Assuming Sm voltage rising rate k=VClamp/trising, Cs can be further simplified, where k particularly is 1 kV/µs in this paper.

$$Cs \approx \left(trising \cdot \frac{Ith}{VClamp}\right) \rightarrow Cs \approx \frac{Ith}{k} \quad (\text{EQ. 2})$$

A.2. Selecting Rs

There are two criteria for selecting Rs described below.

(1) As Ss holds Vdc during OFF-state, Rs is chosen at least two orders of magnitude lower than the off-state resistance of Ss.

(2) After reducing fault current to a leakage value in mode IV of FIG. 6, iRs=Vdc/Rs is added to the MOV leakage current, meaning iSs=iMOV+iRs. To keep Rs compact, iRs is limited to iRs,max=100 mA in this paper, resulting in Rs≥Vdc/iRs,max. Besides, to accelerate Cs discharge during Tdis=t5–t4 of mode IV, Rs should be limited. Therefore, Equation (3) is concluded:

$$Vdc/iRs,\max \leq Rs \leq (Tdis/(5 \times Cs)) \quad (\text{EQ. 3})$$

A.3. Selecting MOV

Vdc,MOV, VClamp, rated surge energy ERated, and peak pulse current ipulse are important parameters in selecting MOVs. As MOV-RCS snubber eliminates leakage currents in MOVs using Ss, the design objective is finding VClamp while satisfying ERated and ipulse. There are two criteria for MOV as follows.

(1) According to FIG. 41, Table I, minimizing VClamp helps to reduce voltage stress on Sm, Cs, and Rs for a compact design.

(2) A low VClamp increases the fault current extinguishing time, defined as tET=t3–t2 in FIG. 7. As tET rises, the MOV dissipates more energy. If the energy exceeds ERated, the MOV might fail as a short circuit. Then, tET and ERated are considered to define the low boundary of MOV clamping voltage below:

$$VClamp > (LLine \cdot idc, \max \cdot Ptr)/Erated + Vdc \quad (\text{EQ. 4})$$

where Ptr is the transient power on MOV during interruption.

In addition, the MOV leakage current iMOV under the DC bus voltage Vdc needs to be analyzed. As illustrated in mode III in section II.B.1, the current in the snubber switch Ss reduces to iSs=iMOV+iRs after interrupting the fault current in the system. In the MOV-RCS snubber with half-controlled switch shown in FIG. 3, to turn the thyristor Ss off, iSs needs to be less than IH. To calculate iSs in this mode, iRs is given as Vdc/Rs, and iMOV can be estimated by simulating the MOV SPICE model given by the manufacturer. It is noted that having a low iMOV and achieving a high switch voltage utilization rate ηv are contrary to each other, since increasing Vdc raises rev and iMOV at the same time. This point needs to be considered in selecting the MOV.

A.4. Selecting Ss

There are two criteria in selecting Ss, including the voltage rating and pulse current capability. Regarding FIG. 41, Table I, vSs does not exceed Vdc; Also, the peak pulse current in Ss reaches Imax. But its duration is short as described in section II.C.

With respect to FIG. 3(a), in case a thyristor is used for Ss, two additional criteria should be considered. First, during mode II in FIG. 7, before turning Sm off, Ss is be ON; therefore, Ss turn-on delay is important. Second, to turn Ss off naturally in mode III (t3<t<t4), iSs=iMOV+iRs is lower than the holding current of the thyristor IH, meaning iSs<IH.

B. AMOV-RCD based SSCB, Components Selection

The selections of Cs, Rs2, MOV, and Ss follow section III. A. In addition, considering rated current of Sm as ISm, rating, Rs and Ds are selected by satisfying (5) and (6), respectively:

$$Rs1 \geq Vdc/ISm, \text{rating} \quad (\text{EQ. 5})$$

$$IDs \geq \rho \cdot Ith \text{ and } VRSM \geq Rsl \cdot Idis \quad (\text{EQ. 6})$$

where IDs is current flowing through Ds; ρ>1 maintains a safe margin; VRSM is the surge reverse voltage of Ds, and Idis is peak discharge current of Cs during turning Sm on.

Figure 10:
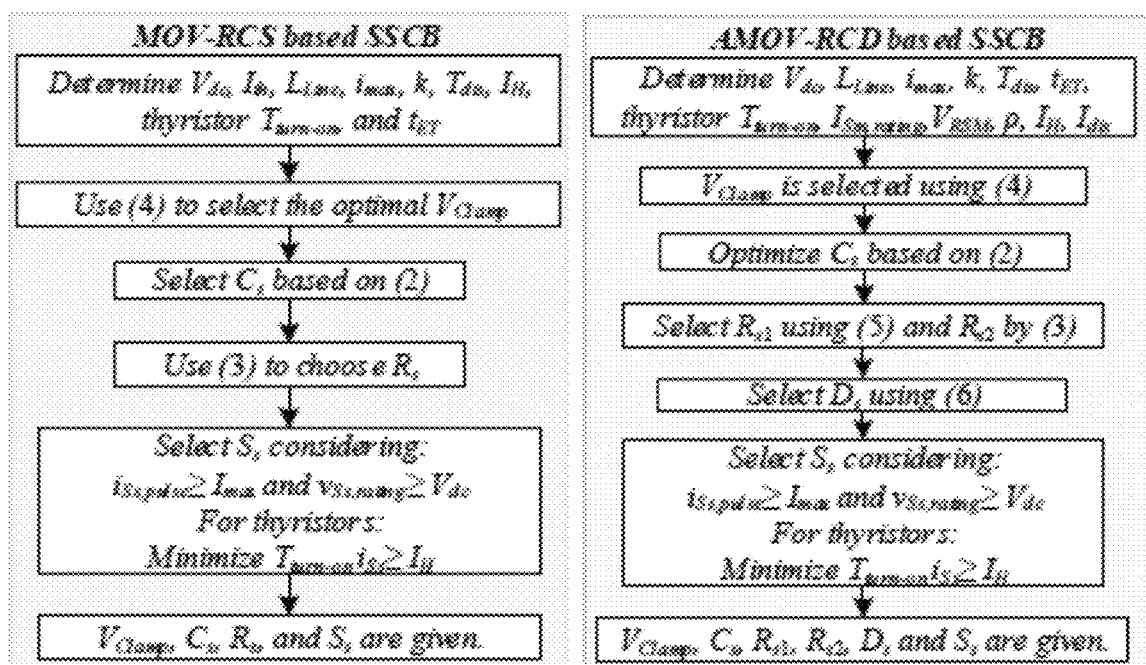
FIG. 10 shows design procedures of MOV-RCS and AMOV-RCD.

FIG. 10 summarizes the design procedures.

IV. Designs

A. Operating Speed Analysis

Figure 11:
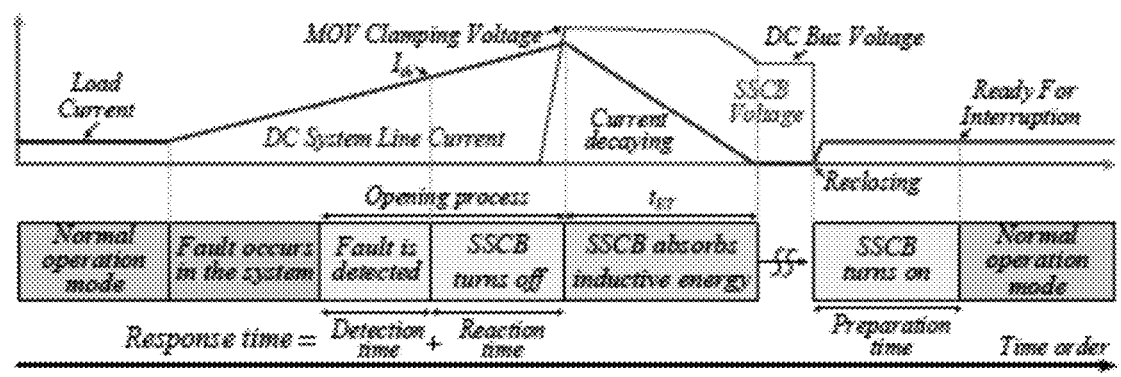
FIG. 11 shows operation of SSCBs during opening/reclosing process.

FIG. 11 indicates the operation of SSCBs during breaking and the following reclosing, including three intervals: 1) detection, 2) reaction, and 3) preparation. The reaction and preparation intervals of the proposed SSCBs are analyzed in this section. The detection interval is not discussed in great detail herein.

A. 1. Reaction Time Interval

Figure 12A:
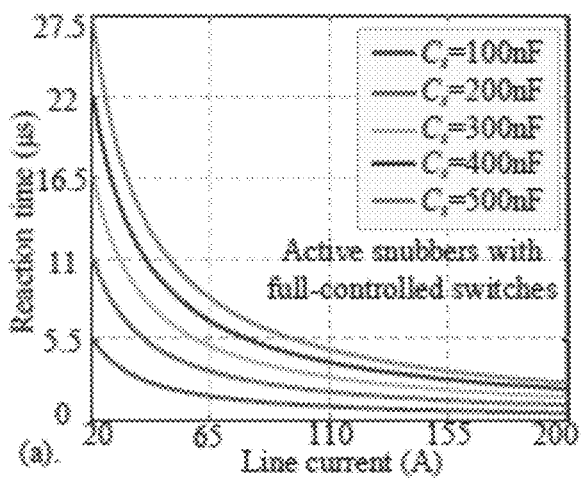
FIG. 12(a) shows reaction time of active snubbers with full-controlled switches; for thyristors-based topologies, turn-on delay is added.

The reaction interval in the proposed active snubbers of FIGS. 2(a) and 4(a) is the interval required to charge Cs. This is labeled as t2–t1 in FIG. 7 and t3–t1 in FIG. 9. FIG. 12(a) displays reaction interval of the active snubbers with full-controlled switches for different Cs and iLine when VClamp is 1.1 kV. The reaction interval in active snubbers of FIGS. 3(a) and 5(a) includes an additional turn-on delay of the thyristors (labeled as t–t in FIG. 9).

Compared with the conventional MOV-RCD, the proposed MOV-RCS snubber presents the same reaction time interval. For the proposed AMOV-RCD, the reaction time rises by the turn-on delay of the thyristors in the snubber branch. This delay is typically within microseconds (usually below 10 μs) even when DC bus voltage increases to a medium voltage range. Therefore, for DC systems with low line inductance, the active snubbers with full-controlled snubber switches are preferable since they present a faster response speed during interruption.

A.2. Preparation Time Interval

Preparation interval is defined from the reclosing instance (Sm turn-on) to the point in which the SSCB is ready for the next interruption. According to working principle of MOV-RCS based SSCB in section II.B.1, vCs reduces to zero during t4≤t<t5 in FIG. 7. So, the preparation interval is zero.

Figure 12B:
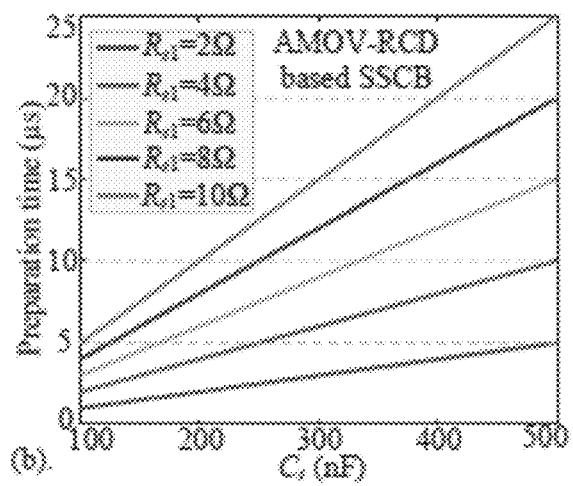
FIG. 12(b) shows preparation time of AMOV-RCD based SSCB; preparation time of MOV-RCS snubber is zero.

According to AMOV-RCD operation in section II.B.2, Cs holds Vdc during the SSCB OFF-state. As SSCB recloses (Sm turns on), Cs discharges on Sm through Rs1. SSCB is ready for the next interruption when Cs is discharged. Cs discharge time is the preparation interval in AMOV-RCD, which is the same as MOV-RCD. FIG. 12(b) indicates the preparation interval of AMOV-RCD snubber for different Cs.

B. MOV Energy Absorption Analysis

The fault current extinguishing time tET is labeled in FIG. 11, where the MOV absorbs inductive energy of the line inductor.

With respect to section II, the energy is approximated as below:

$$E_{MOV} \approx L_{Line} \cdot I_{max}^2 \cdot (V_{Clamp}/(2 \cdot (V_{Clamp} - V_{dc}))) \quad (EQ. 7)$$

Figure 13A:
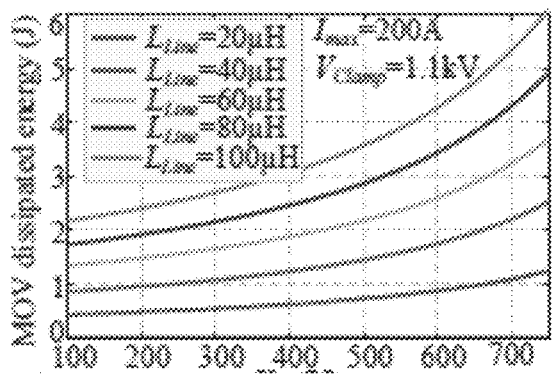
FIG. 13 shows energy in MOV for different LLine, Imax, and Vdc.
Figure 13B:
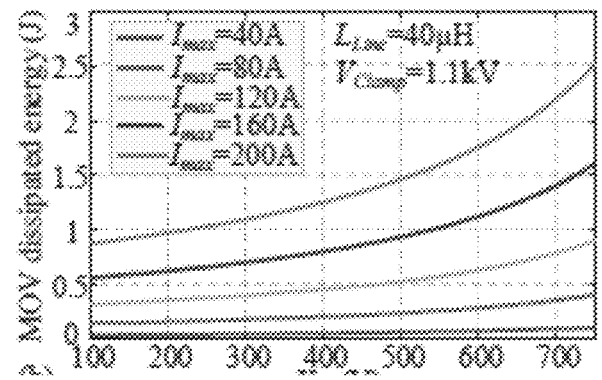

For example, FIG. 13 shows the dissipated energy in MOV for different Vdc, LLine, and Imax when VClamp=1.1 kV. The energy rises as LLine, Imax, and Vdc increase.

C. Main Switch Voltage Utilization Rate Analysis

Figure 14:
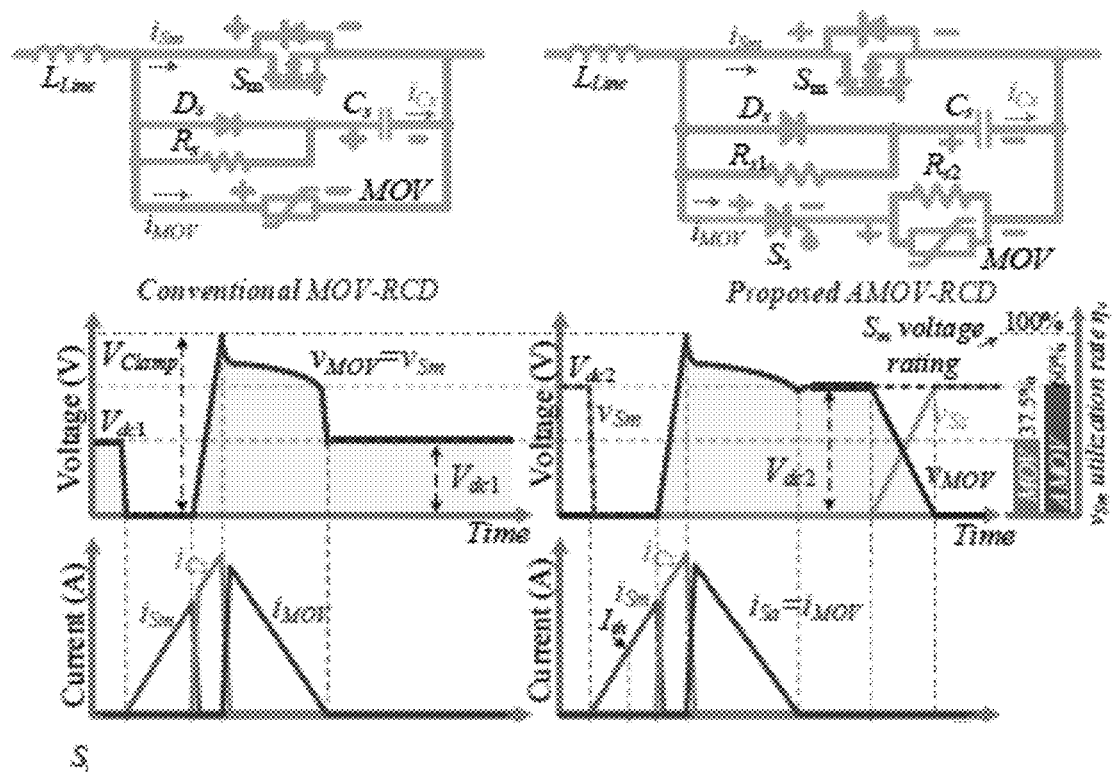
FIG. 14 shows main switch ηv analysis in conventional MOV-RCD and AMOV-RCD. MOV-RCS has the same functionality.

According to Equation (1), ηv of Sm can be enhanced by increasing Vdc. In conventional MOV-RCD, Vdc≤0.8×Vdc, MOV is recommended to avoid leakage currents. For example, for V420LA40BP MOV with VClamp=1.06 kV and Vdc,MOV=560 V, Vdc is limited to 450 V. In this case, for 1.2 kV SiC MOSFETs, ηv=37.5% ((450/1200)×100%). While ηv can be enhanced to 60% by the proposed active snubbers as shown in FIG. 14 and verified by the experiments. By employing MOV-RCS and AMOV-RCD, DC bus voltage is increased from Vdc1 to Vdc2, where it is limited by the MOV leakage current iMOV to satisfy iMOV+ iRs<IH in MOV-RCS and iMOV<IH in AMOV-RCD (as noted in section III.A.3). Advantages of extending TI v in SSCBs are discussed in section V.

V. Advantages of the Active Snubbers

A. Efficiency Improvement

The proposed snubbers improve the SSCB efficiency ηSSCB by extending the maximum allowable DC bus voltage on the breaker. By considering Equations (1), (8) defines ηSSCB:

$$\eta_{SSCB} = (1 - (R_{on} \cdot I_{dc} / \eta_v \cdot V_{Sm,rating})) \times 100\% \quad (8)$$

where Ron is the on-state resistance of Sm, and VSm, rating is Sm voltage rating. ηSSCB can be improved from two aspects:

For a fixed number of switches in series for Sm (Ron is constant), increasing ηv enhances ηSSCB.

Enhancing ηv can reduce Ron, meaning higher ηSSCB. That is, to meet a specific voltage rating, number of series connected switches for Sm decreases, which reduces Ron.

Figure 15A:
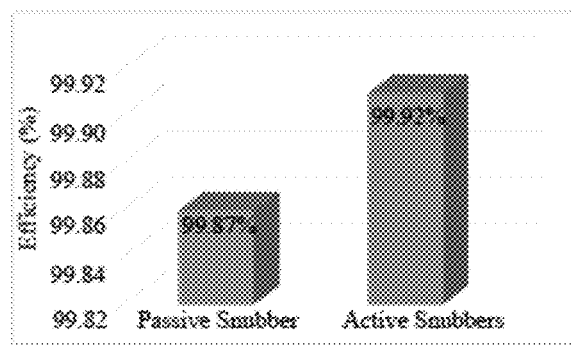

For example, by considering a single C3M0016120D SiC MOSFET with Ron=20 mΩ as the main switch Sm, ηv=37.5% for MOV-RCD snubber and ηv=60% for the active snubbers, and assuming the nominal load current of Idc=30 A, the efficiency is calculated as 99.87% for the conventional MOV-RCD based SSCB and 99.92% for the proposed active snubber based SSCBs, indicated graphically in FIG. 15(a).

B. Power Density Enhancement

Extending ηv increases the power density from three aspects:

(1) It reduces the number of series-connected switches in Sm.

(2) As Sm cooling system takes most of density in SSCBs, lower switches for Sm substantially improve compactness.

(3) Extending Vdc also helps to increase power density.

The heat sink cooling system is fit for 30 A steady-state current. Sm is connected to the heat sink from the bottom; Ss is a C3M0016120D MOSFET and needs no heat sink. Meanwhile, adding solid-state switches in active snubbers Ss does not decrease the power density, which is because:

(1) Ss needs no cooling systems as it only conducts a pulse current in a range of tens to hundreds of microseconds.

(2) Ss holds only Vdc according to FIG. 41, Table I, and efficiency may not be a design criterion for Ss. Therefore, the number of switches for Ss is low especially when thyristors with high voltage rating and pulse current capability are used.

Figure 15B:
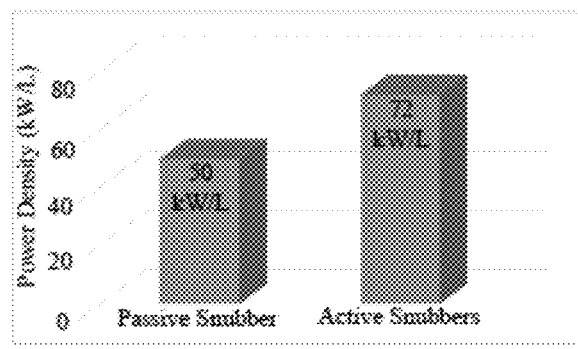
Figure 16:
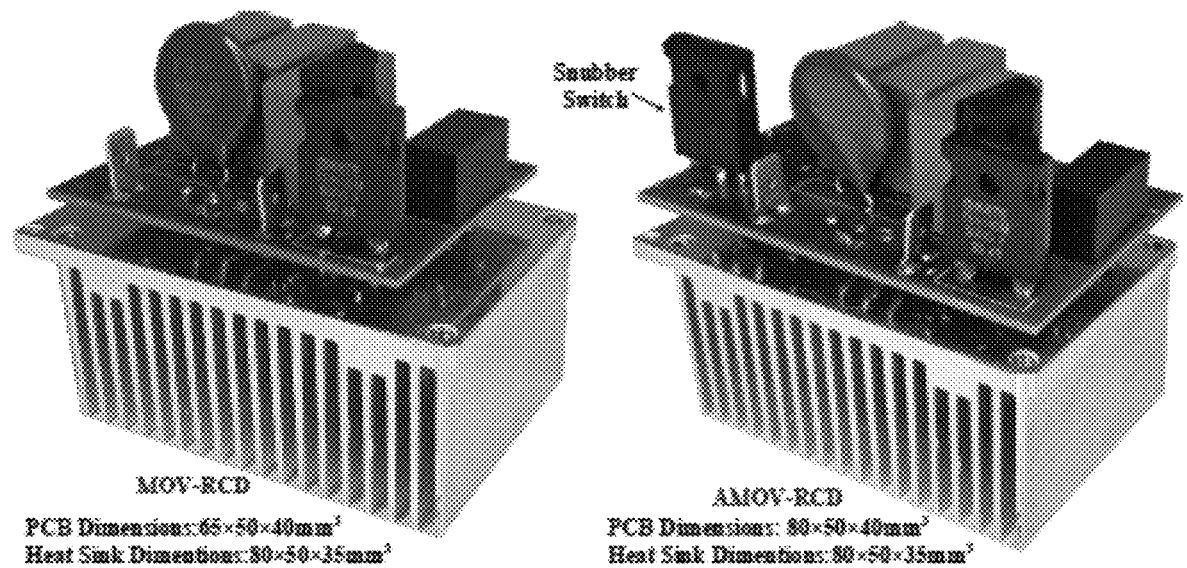
FIG. 16 shows power density comparison of 720V/300 A AMOV-RCD and 450V/300 A MOV-RCD for nominal load current of 30 A.

FIG. 16 shows the prototypes of AMOV-RCD and MOV-RCD. A nominal load current is 30 A, where the same heat sink has been used for both passive and active snubbers. ηv is considered as 37.5% for MOV-RCD snubber and 60% for the proposed AMOV-RCD snubber. Regarding the dimensions of the circuit boards and the selected heat sink, the volume of MOV-RCD is 0.27 L, while AMOV-RCD uses the total space of 0.3 L. The conventional MOV-RCD achieves the power rating of 13.5 kW (450 V×30 A) resulting in 50 kW/L power density. However, the proposed AMOV-RCD enhances the power rating to 21.6 kW (720 V×30 A) leading to 72 kW/L power density. In comparison, the proposed active snubbers can improve power density by 44% which is shown in FIG. 15(b).

C. Design Cost Reduction

Active snubbers can reduce the cost of SSCBs when multiple switches are connected in series for main switch Sm. As solid-state switches take the most cost of SSCBs, reducing the number of series/parallel switches in Sm leads to a significant cost reduction. There are two main reasons as below:

(1) The number of switches in series for Sm is decreased. As the active snubbers improve ηv, smaller number of switches can handle Vdc and VClamp.

(2) As the number of switches in series decreases, the equivalent on-state resistance of the SSCB is reduced as well. Therefore, a smaller number of switches in parallel satisfies the required efficiency.

Figure 4:
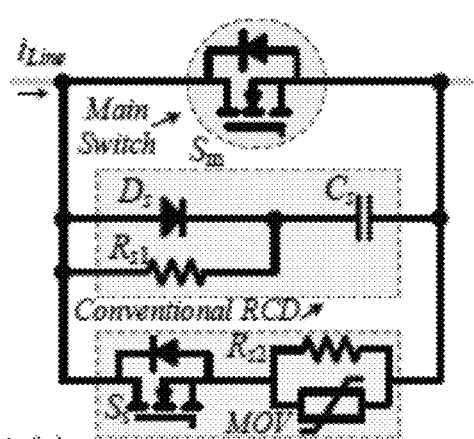
FIGS. 4(a) and 4(b) show AMOV-RCD based SSCB; Ss is a full-controlled switch.
Figure 4:
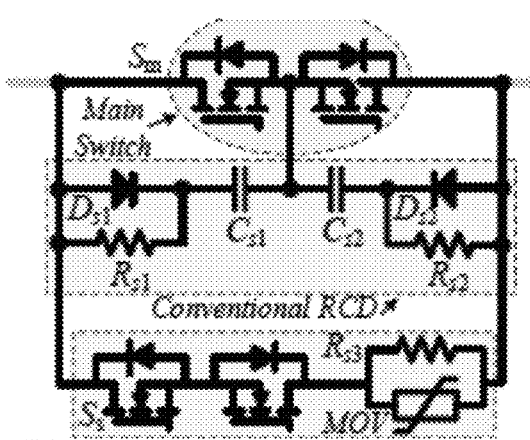
Figure 5:
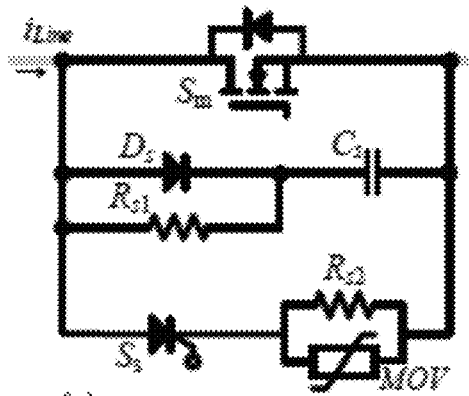
FIGS. 5(a) and 5(b) show AMOV-RCD based SSCB; Ss is a half-controlled switch.
Figure 5:
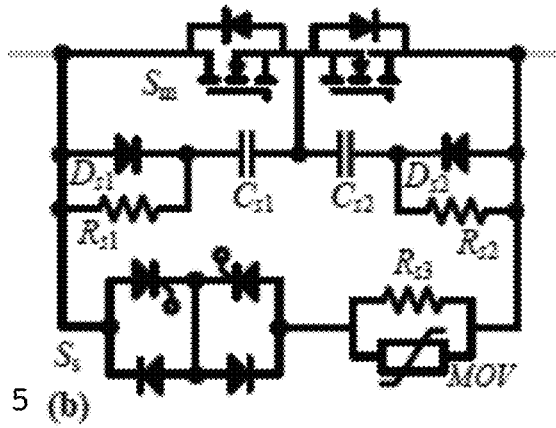

FIG. 42, Table II shows a comparison between the required number of switches for the proposed MOV-RCS (FIGS. 2(*a*) and 3(*a*)), AMOV-RCD (FIGS. 4(*a*) and 5(*a*)), and the passive MOV-RCD snubbers, where the nominal load current and efficiency are 100 A and 99.97%, respectively. The C3M0016120D SiC MOSFET with Ron=20 mΩ is the full-controlled switch, and SK655KD thyristor is the half-controlled switch. In FIG. 42, Table II, ηv is 60% for the proposed active snubbers and 37.5% for the MOV-RCD snubber. Regarding the DC bus voltage Vdc, Equation (9) determines the number of switches in series Ns for Sm as below:

$$NS \geq (Vdc/(1200 \times nv)) \quad \text{(EQ. 9)}$$

Also, to satisfy the required efficiency ηSSCB, the number of switches in parallel NP for Sm is found using (10):

$$Np \geq ((NS \times 0.02 \times Idc)/(Vdc \times (1-\eta SSCB))) \quad \text{(EQ. 10)}$$

With respect to Equations (9) and (10), the results are shown in FIG. 42, Table II under four different Vdc. For Vdc≤500V, the number of solid-state switches for active snubbers is slightly higher. However, when Vdc increases, the effect of higher ηv in reducing the total number of solid-state switches is obvious. For example, for Vdc=500 V, the total number of switches in the active snubbers is 16; while MOV-RCD snubber needs 14 MOSFETs. Regarding the selected MOV, when the DC bus voltage goes above 500 V, the number of switches in the proposed active snubbers reduces considerably. For instance, when Vdc=4 kV, the active snubbers use 68 SiC MOSFETs in total for Sm and Ss; while the MOV-RCD snubber needs 135 MOSFETs.

Figure 15C:
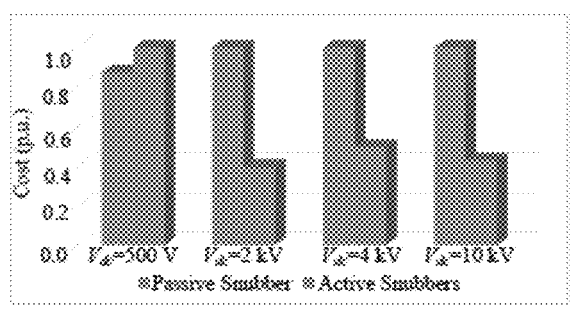

Regarding FIG. 42, Table II, FIG. 15(*c*) graphically shows the cost comparison between the proposed active snubbers and the conventional passive snubber. It shows active snubbers can bring considerable cost reduction in the term of reducing the number of solid-state switches.

D. Reliability Improvement

Adding a solid-state switch to snubber circuits solves the MOV degradation issue, which substantially enhances the SSCB reliability. As illustrated in section II, during the SSCB OFF-state, the snubber switch Ss holds the DC bus voltage and removes the voltage on MOV. Hence, nor voltage neither power dissipation will appear on the MOV.

Compared with the pure passive MOV-RCD snubber, adding solid-state switches to the snubber branch increases the control complexity. That is, the main control board in SSCBs needs to control the snubber switches Ss as well as the main switches Sm. Also, adding solid-state switches in the snubber branch may impact reliability. On the other hand, there are two points need to be highlighted:

As noted in section V.C, the total number of solid-state switches in the proposed active snubbers is significantly smaller than the total number of switches in the conventional MOV-RCD snubber when DC bus voltage increases, e.g., Vdc>500V, which improves reliability.

Regarding FIGS. 7 and 9, the snubber switch Ss turns on under zero voltage, and it turns off under zero current conditions. Therefore, the proposed active snubbers guarantee a reliable operation of Ss in the proposed active snubbers.

VI. Experimental Validation

Unidirectional breakers of FIGS. 2*a/b* through 5*a/b* and the MOV-RCD snubber of FIG. 14 are implemented. FIG. 16 shows the prototypes of AMOV-RCD and MOV-RCD based SSCBs. It is noted that all the active snubber based SSCBs have the same dimensions and power density.

Figure 17:
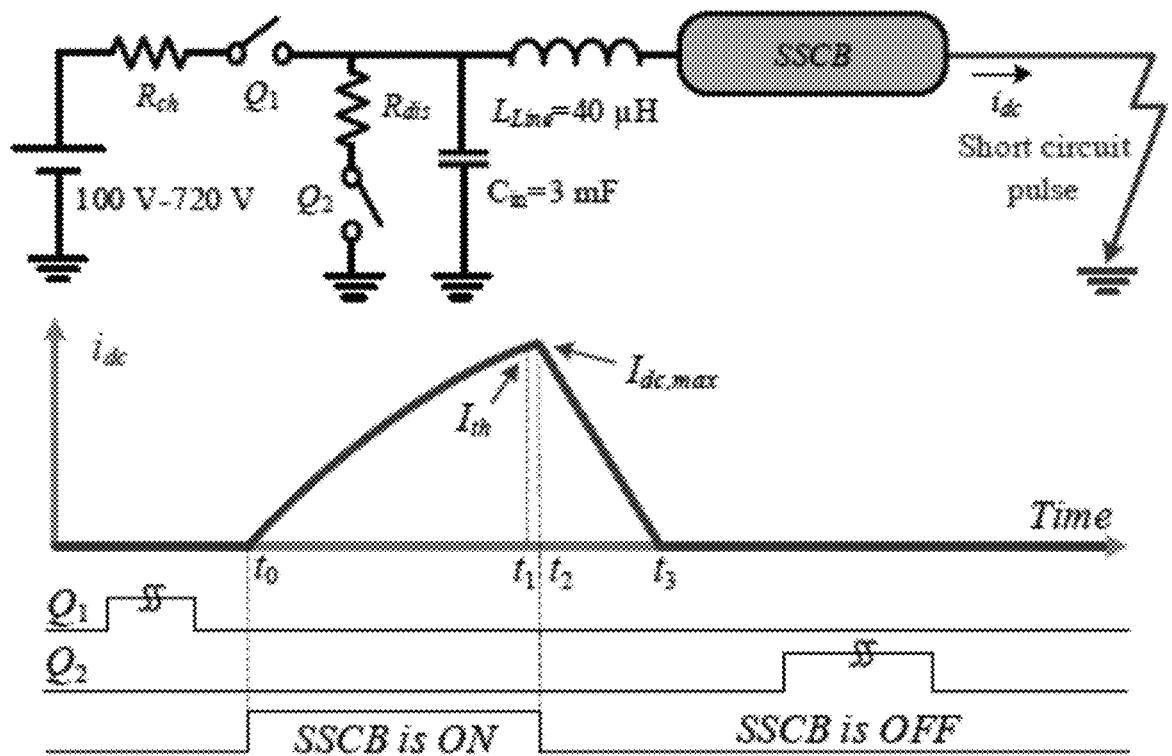
FIG. 17 shows DC test circuit and switches status during experiments. The period t2–t1 stands for the reaction time interval. In the bottom figure, a typical line current is shown for clarification.

FIG. 17 indicates the DC test circuit and the switches status in conducting experiments, and the parameters are listed in FIG. 43, Table III. The DC link capacitor Cin=3 mF is used to obtain a pulse current capability, and the line inductor LLine=40 μH limits the rising rate of the DC current to 18 A/μs under Vdc=720 V.

Switches Q1 and Q2, and resistor Rch and Rdis control the charge and discharge process in Cin. The experiments follow a pre-set time-sequence process reported in the literature.

A. Conventional MOV-RCD Based SSCB

Figure 18:
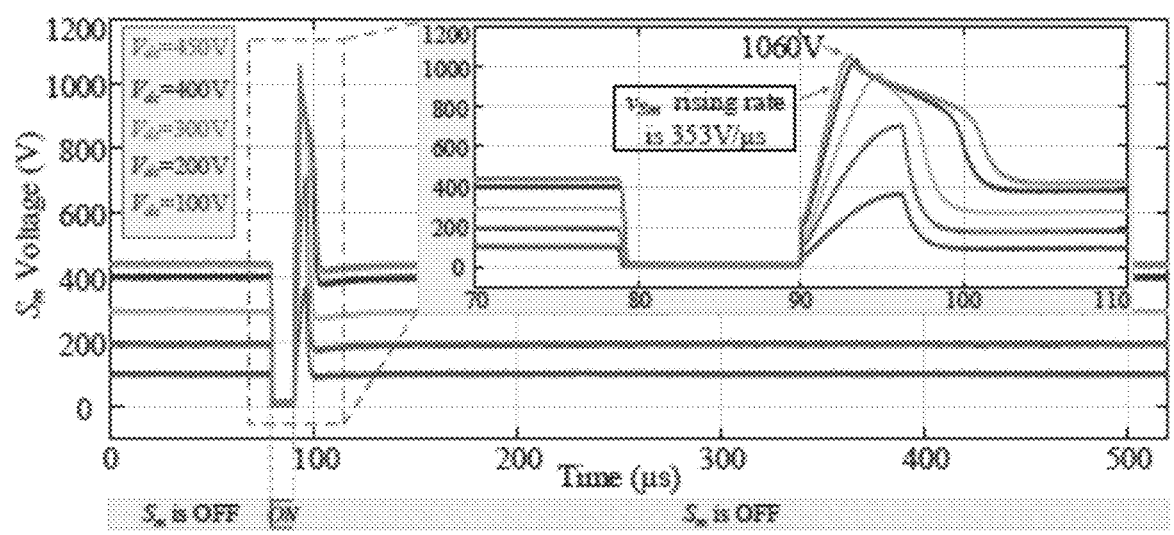
FIG. 18 shows experiments (MOV-RCD): vSm.
Figure 19:
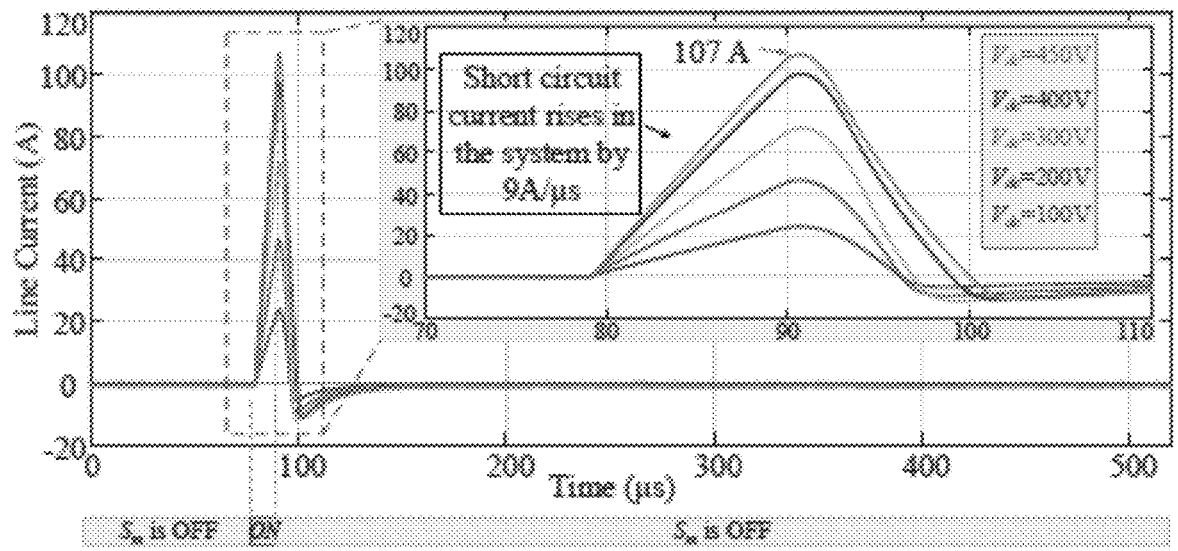
FIG. 19 shows experiments (MOV-RCD): iLine.
Figure 20:
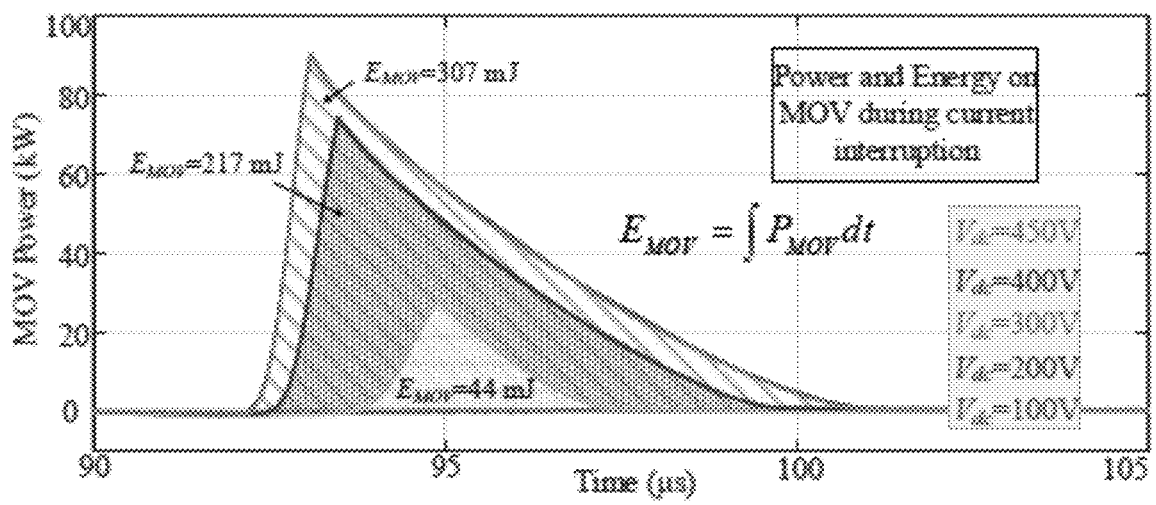
FIG. 20 shows experiments (MOV-RCD): MOV power and energy.

Experimental results of a conventional MOV-RCD based SSCB are presented in FIGS. 18 to 20 under Vdc up to 450 V. As illustrated in section IV.C, Vdc is limited to 450 V to avoid leakage currents on the MOV. There are three highlights below:

(1) Peak voltage on Sm reaches 1060 V.
(2) Maximum fault current is 107 A.
(3) Maximum dissipated energy on the MOV is 307 mJ which is close to estimated value of 398 mJ using Equation (7).

B. MOV-RCS Based SSCB

B.1. MOV-RCS Snubber with Full-Controlled Switch

Figure 21:
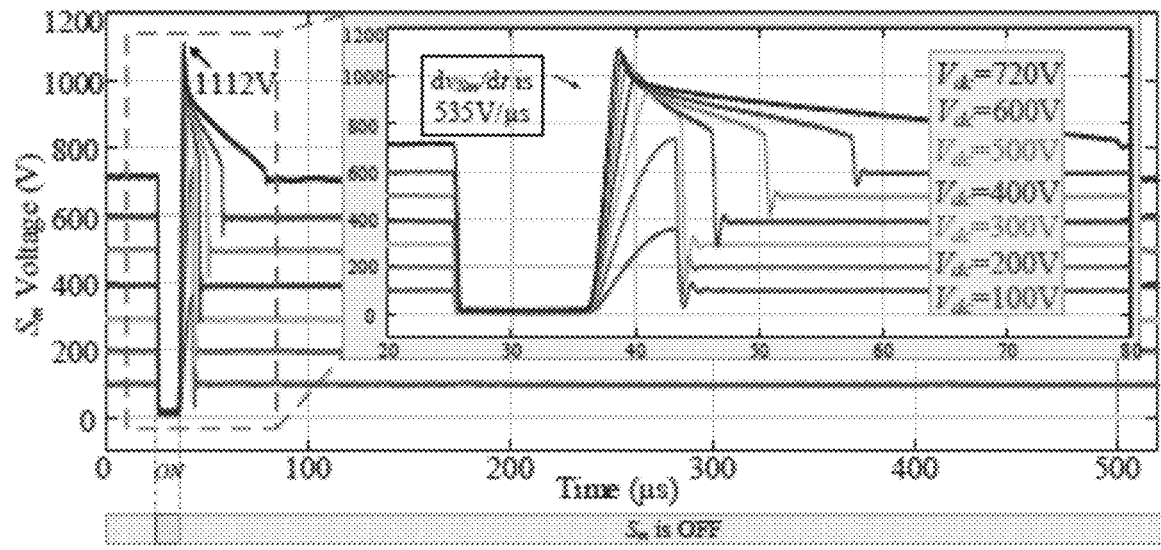
FIG. 21 shows experiments MOV-RCS (full-controlled Ss): vSm.
Figure 22:
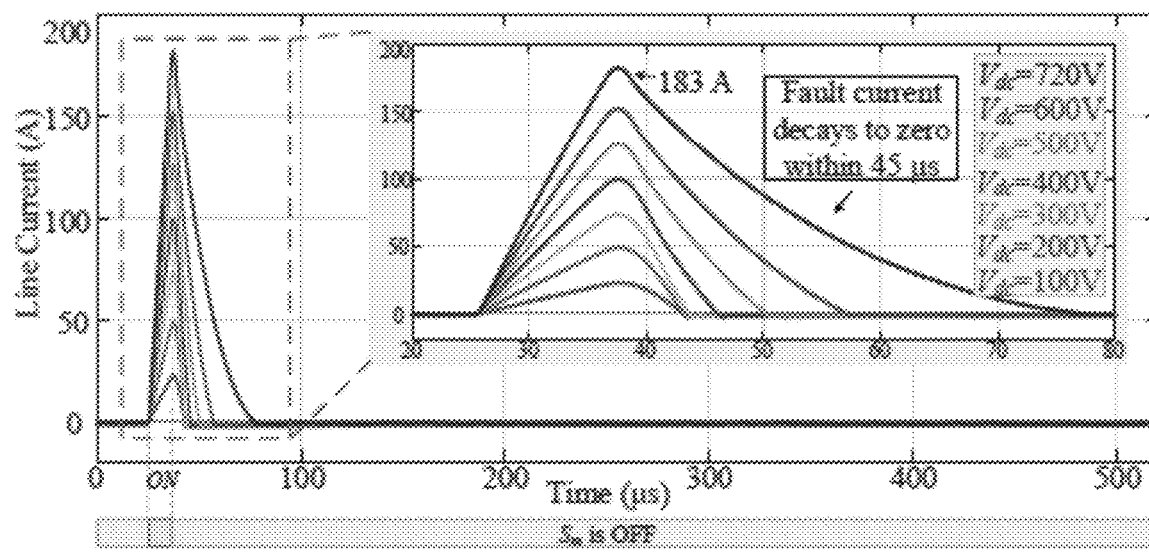
FIG. 22 shows experiments MOV-RCS (full-controlled Ss): iLine
Figure 23:
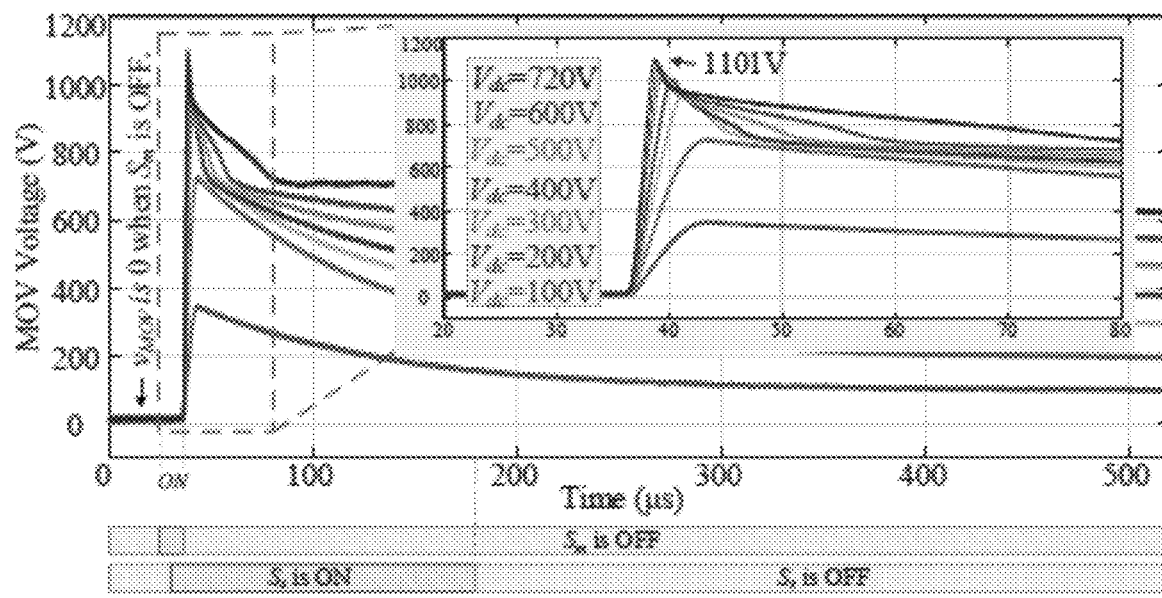
FIG. 23 shows experiments MOV-RCS (full-controlled Ss): vMOV.
Figure 24:
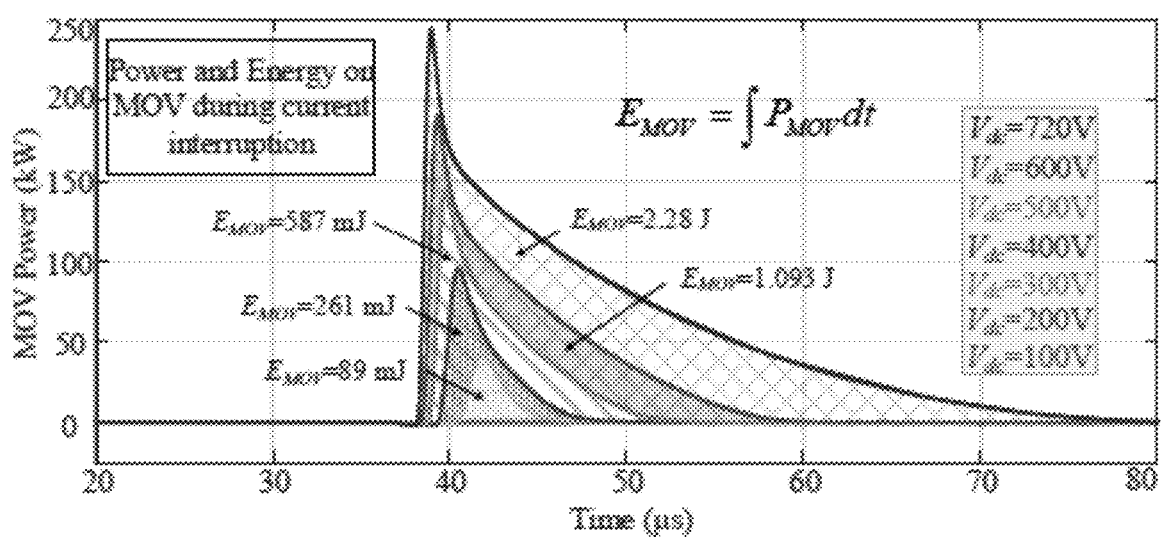
FIG. 24 shows experiments MOV-RCS (full-controlled Ss): MOV power and energy dissipation.
Figure 25:
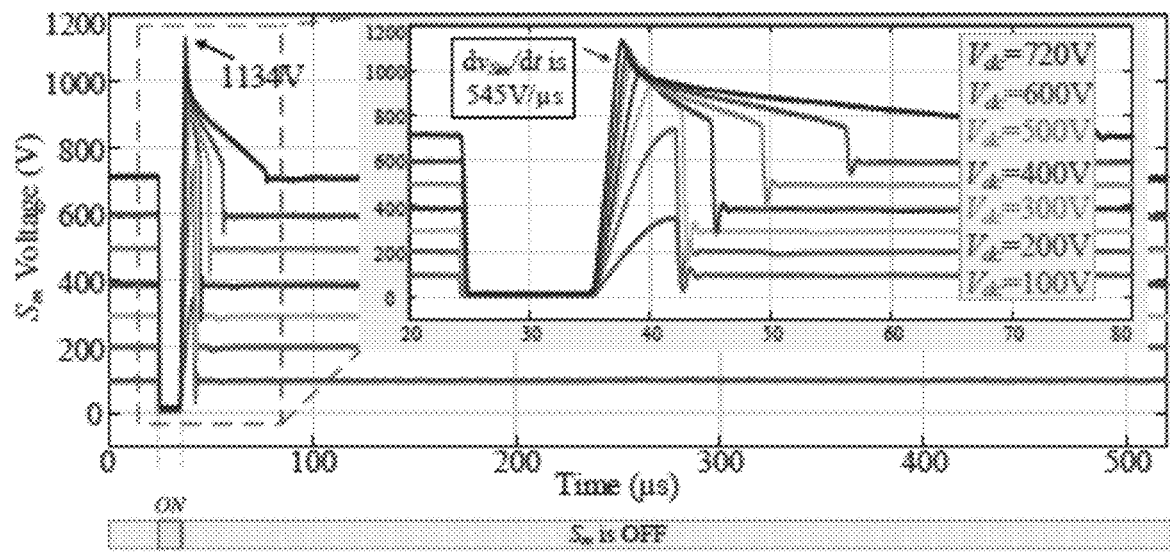
FIG. 25 shows experiments MOV-RCS (half-controlled Ss): vSm.
Figure 26:
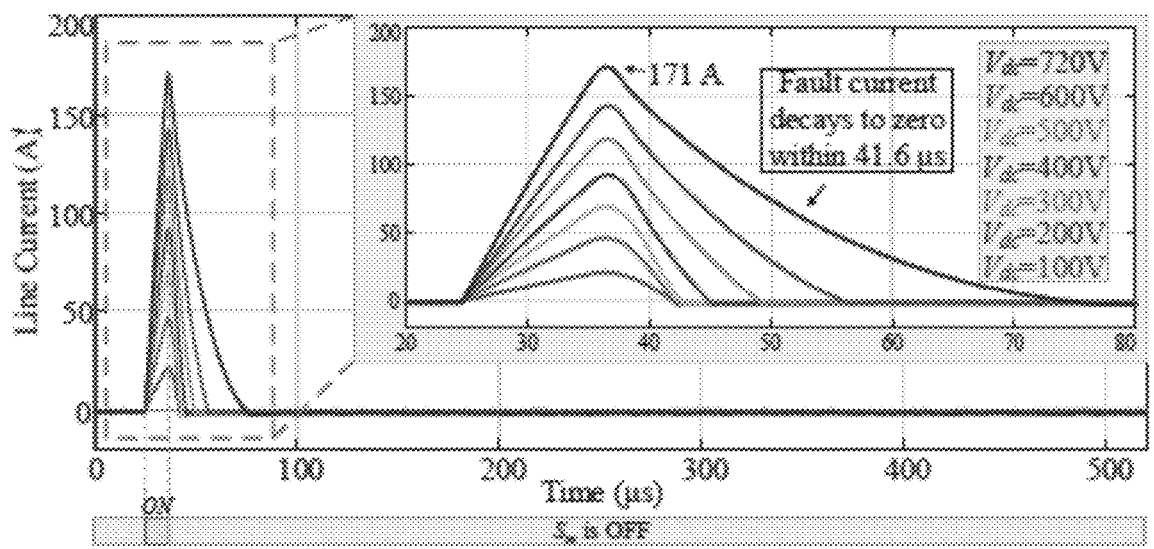
FIG. 26 shows experiments MOV-RCS (half-controlled Ss): iLine.
Figure 27:
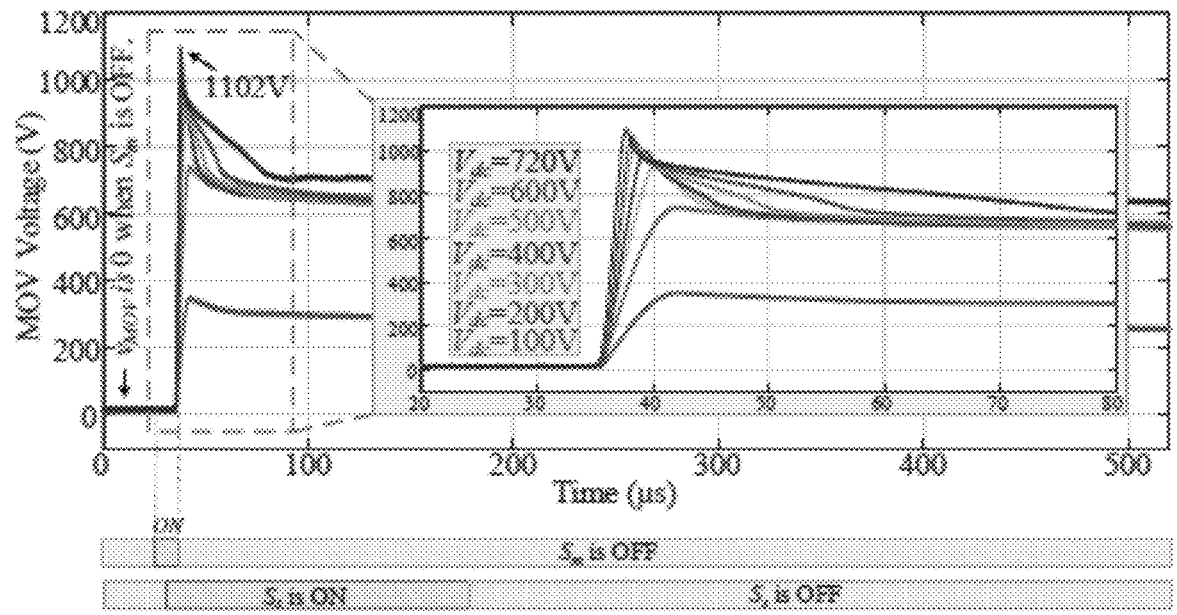
FIG. 27 shows experiments MOV-RCS (half-controlled Ss): vMOV.
Figure 28:
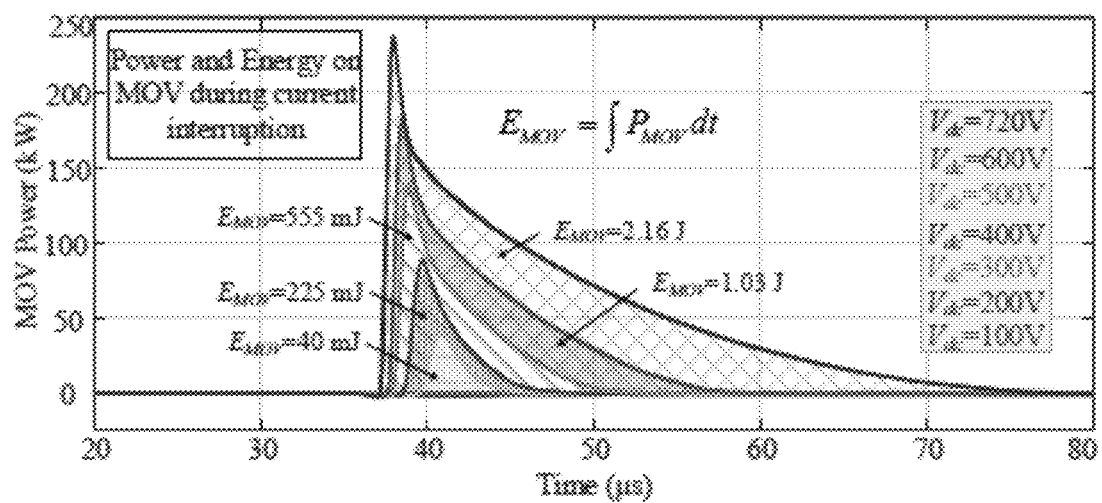
FIG. 28 shows experiments of MOV-RCS (half-controlled Ss): MOV power and energy dissipation.
Figure 29:
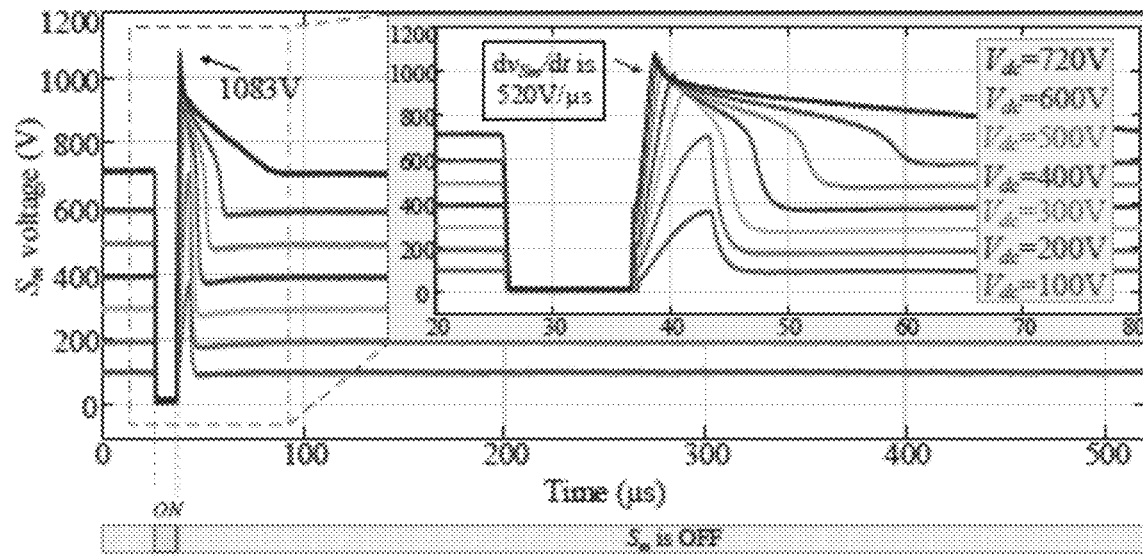
FIG. 29 shows experiments AMOV-RCD (full-controlled Ss): vSm.

The MOV-RCS based SSCB with full-controlled switch is tested; the results are shown in FIGS. 21 to 24. For Ss, a 1.2 kV MOSFET is used. Following points are concluded:

(1) Regarding FIG. 21, Vdc can be increased up to 720 V. Considering Equation (1), ηv of 60% is achieved for Sm.
(2) Regarding FIG. 22, the peak current in the system reaches 183 A under Vdc=720 V, and it decays to zero in 45 μs (=tET).
(3) At the beginning of FIG. 23, MOV voltage is zero when Sm is OFF. After fault interruption, MOV voltage begins decaying to zero. This discharge time Tdis depends on Rs as clarified by (3).
(4) Regarding section IV.A, reaction time interval is 2.4 μs.
5) Maximum dissipated energy on MOV is 2.28 J which has a reliable margin with ERated=160 J, and it is close to 1.9 J as estimated by Equation (7).

B.2. MOV-RCS Snubber with Half-Controlled Switch

MOV-RCS based SSCB is also evaluated with half-controlled switch. SK655KD thyristor is used for Ss. Experimental results are displayed in FIGS. 25 to 28.

Compared with FIGS. 21 to 24, MOV-RCS with a half-controlled switch follows the same operation. It interrupts 171 A DC current under Vdc=720 V, verifying ηv of 60%.

The only difference is the triggering process of Ss. As shown in sections II and IV.A.1, MOV-RCS with half-controlled switch includes a turn-on delay at the beginning of the interruption. This delay is 5 μs for the selected SK655KD. Therefore, the reaction time interval is 5 μs+2.4 μs=7.4 μs.

C. AMOV-RCD Based SSCB

C.1. AMOV-RCD with Full-Controlled Switch

AMOV-RCD with full-controlled switch is validated in this section. The results are shown in FIGS. 29 to 32.

Figure 30:
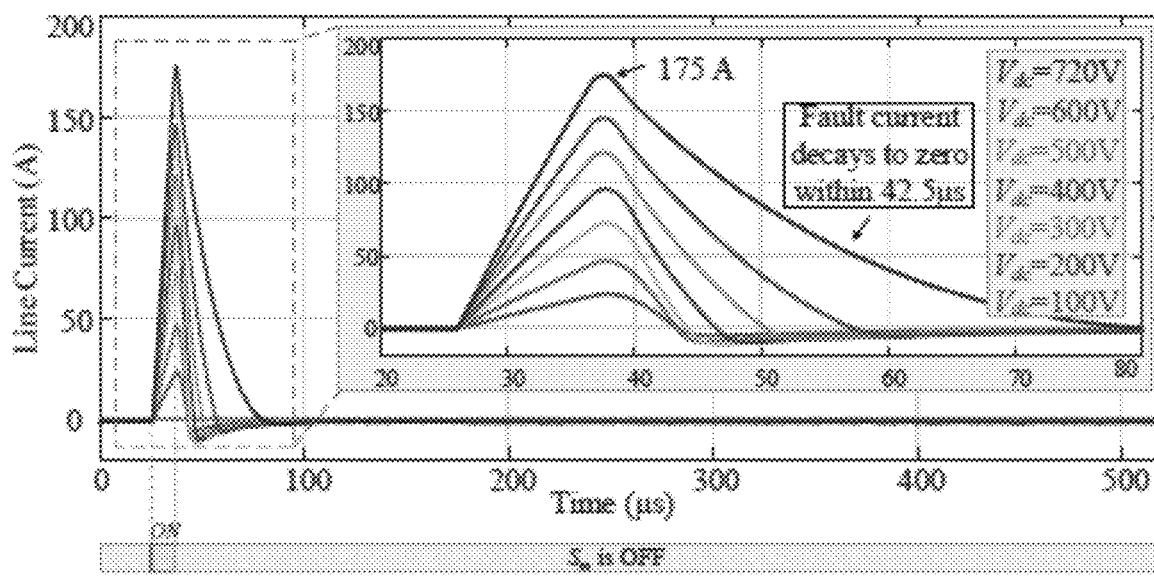
FIG. 30 shows experiments AMOV-RCD (full-controlled Ss): iLine.

(1) AMOV-RCD extends ηv to 60%.
(2) As FIG. 30 indicates, peak current reaches 175 A, and it decays to zero within 42.5 μs. Reaction interval is 2.1 μs.
(3) FIG. 30 represents the MOV voltage and Ss status. The peak MOV voltage is almost the same as overshoot voltage on Sm, verifying section II analysis. The MOV voltage reduces to zero during SSCB OFF-state, and the process is faster compared with MOV-RCS operation in FIGS. 23 and 27.

Figure 32:
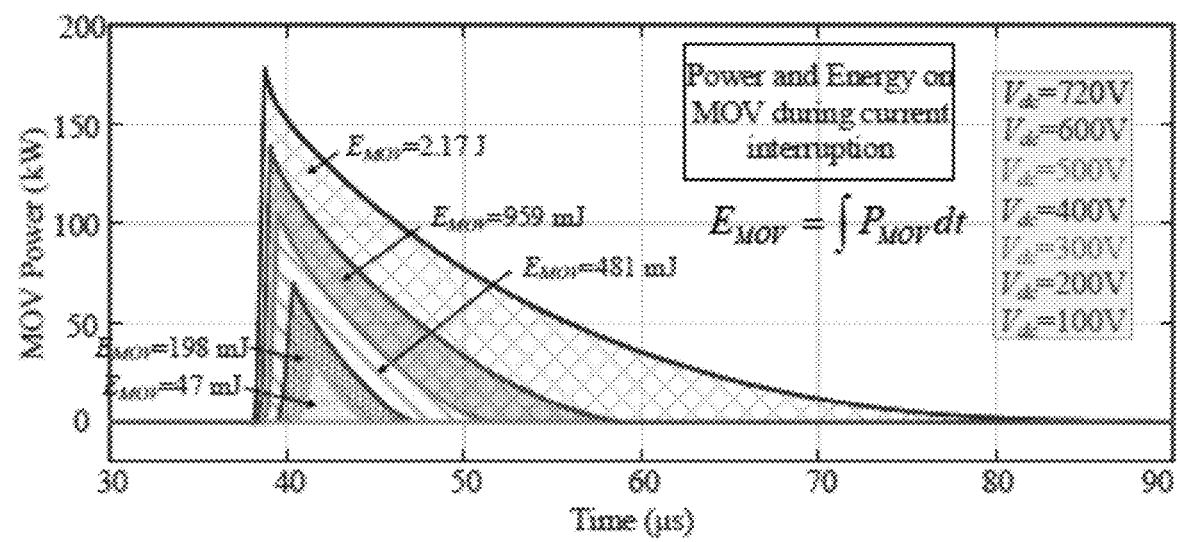
FIG. 32 shows experiments AMOV-RCD (full-controlled Ss): MOV power and energy dissipation.
Figure 33:
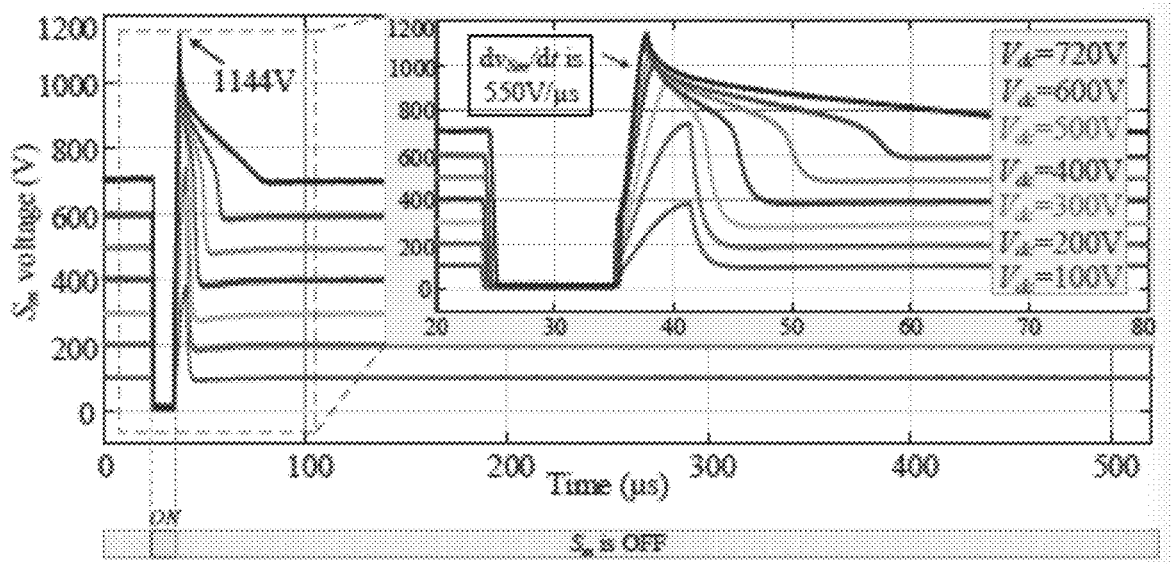
FIG. 33 shows experiments AMOV-RCD (half-controlled Ss): vSm.
Figure 34:
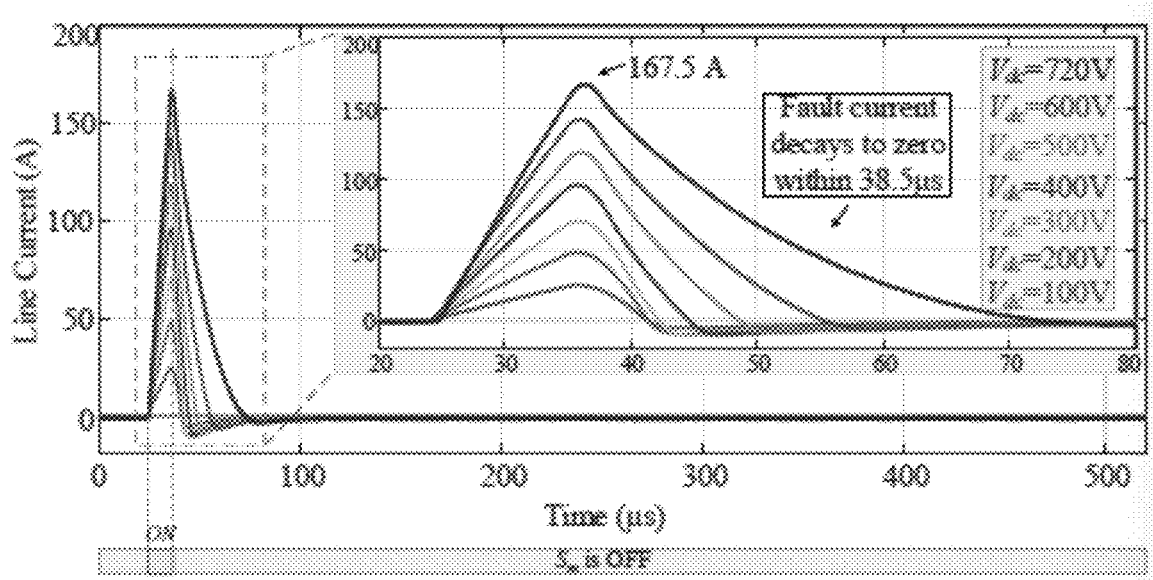
FIG. 34 shows experiments AMOV-RCD (half-controlled Ss): iLine.

4) FIG. 32 shows the power and energy on MOV. Compared to FIGS. 24 and 28, MOV transient power in the AMOV-RCD topology is smaller, but the dissipated energy is the same. The energy values are consistent with Equation (7) and FIG. 13.

C.2. AMOV-RCD with Half-Controlled Switch

Experiments are also conducted for AMOV-RCD with half controlled switch. Results are shown in FIGS. 33 to 36. At Vdc=720 V, SSCB interrupts 167.5 A within a reaction interval of 5 µs+2.6 µs=7.6 µs, where 5 µs is the Ss thyristor delay, and 2.6 µs is the snubber capacitor charging time. The Sm peak voltage is 1144 V.

Figure 31:
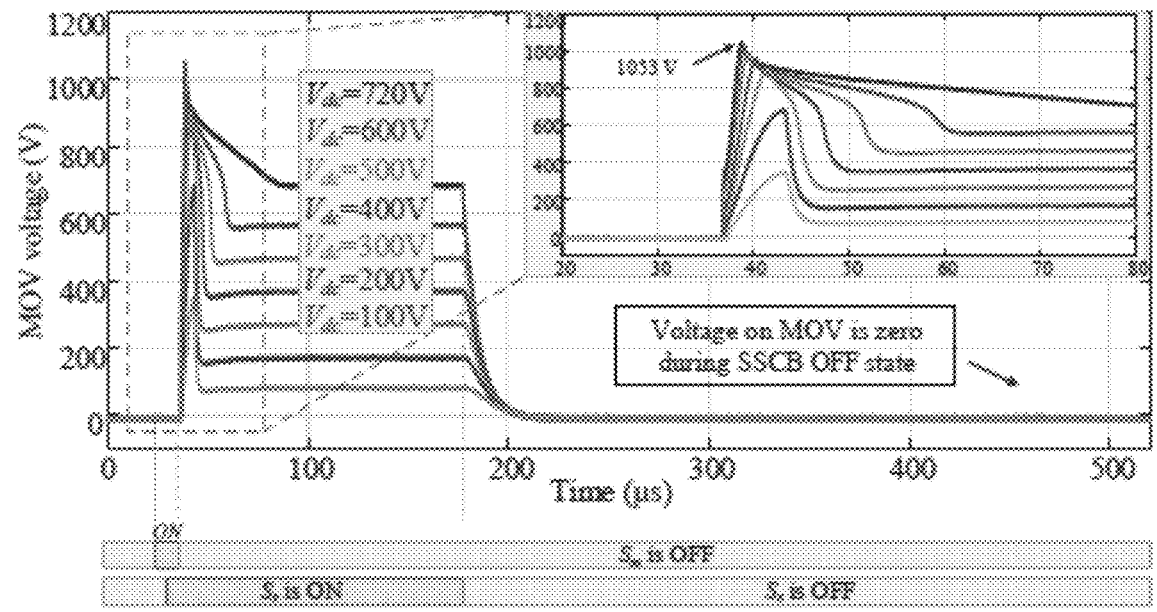
FIG. 31 shows experiments AMOV-RCD (full-controlled Ss): vMOV.
Figure 35:
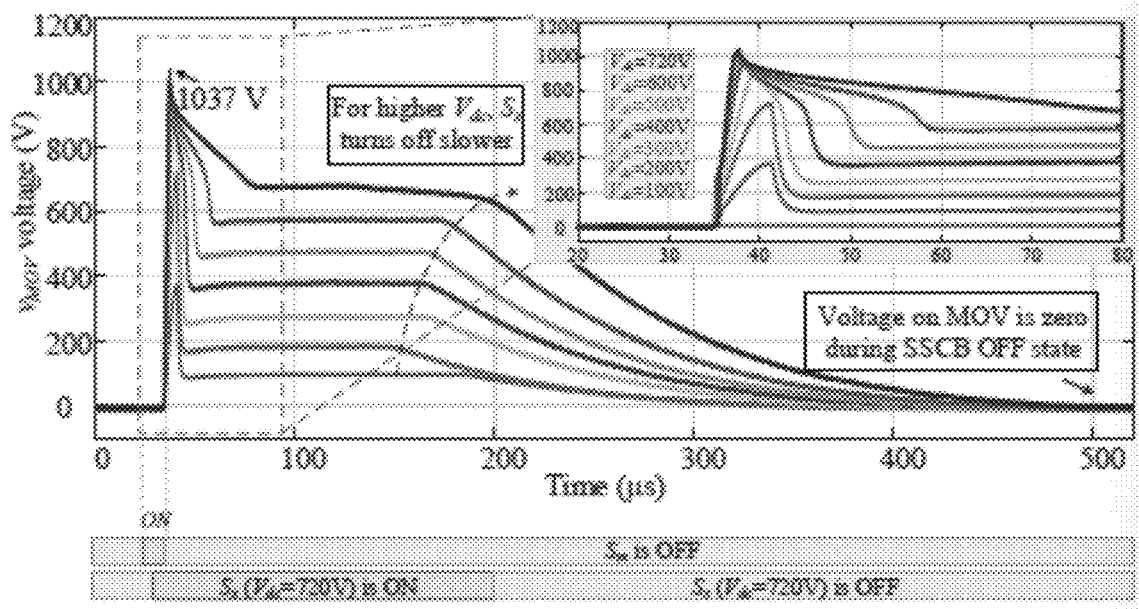
FIG. 35 shows experiments AMOV-RCD (half-controlled Ss): vMOV.
Figure 36:
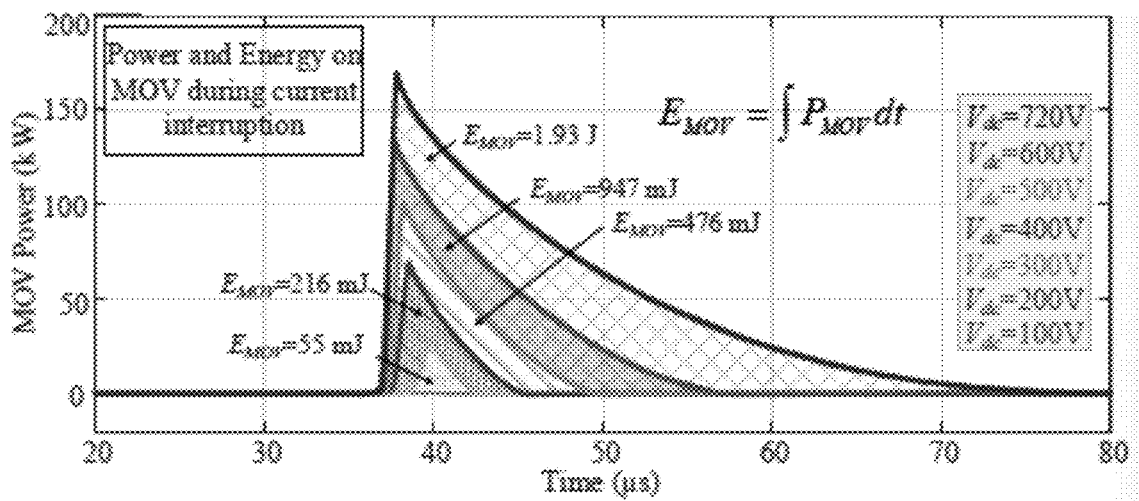
FIG. 36 shows experiments AMOV-RCD (half-controlled Ss): MOV power and energy dissipation.

By Comparing FIG. 31 and FIG. 35, the MOV voltage reduces to zero slower in AMOV-RCD with a half-controlled switch.

D. Snubber Switch Analysis

As shown in sections II and V.D, for all the active snubbers, Ss turns on under zero voltage and turns off under zero current, obtaining a safe operation for Ss during DC current interruption.

Figure 37:
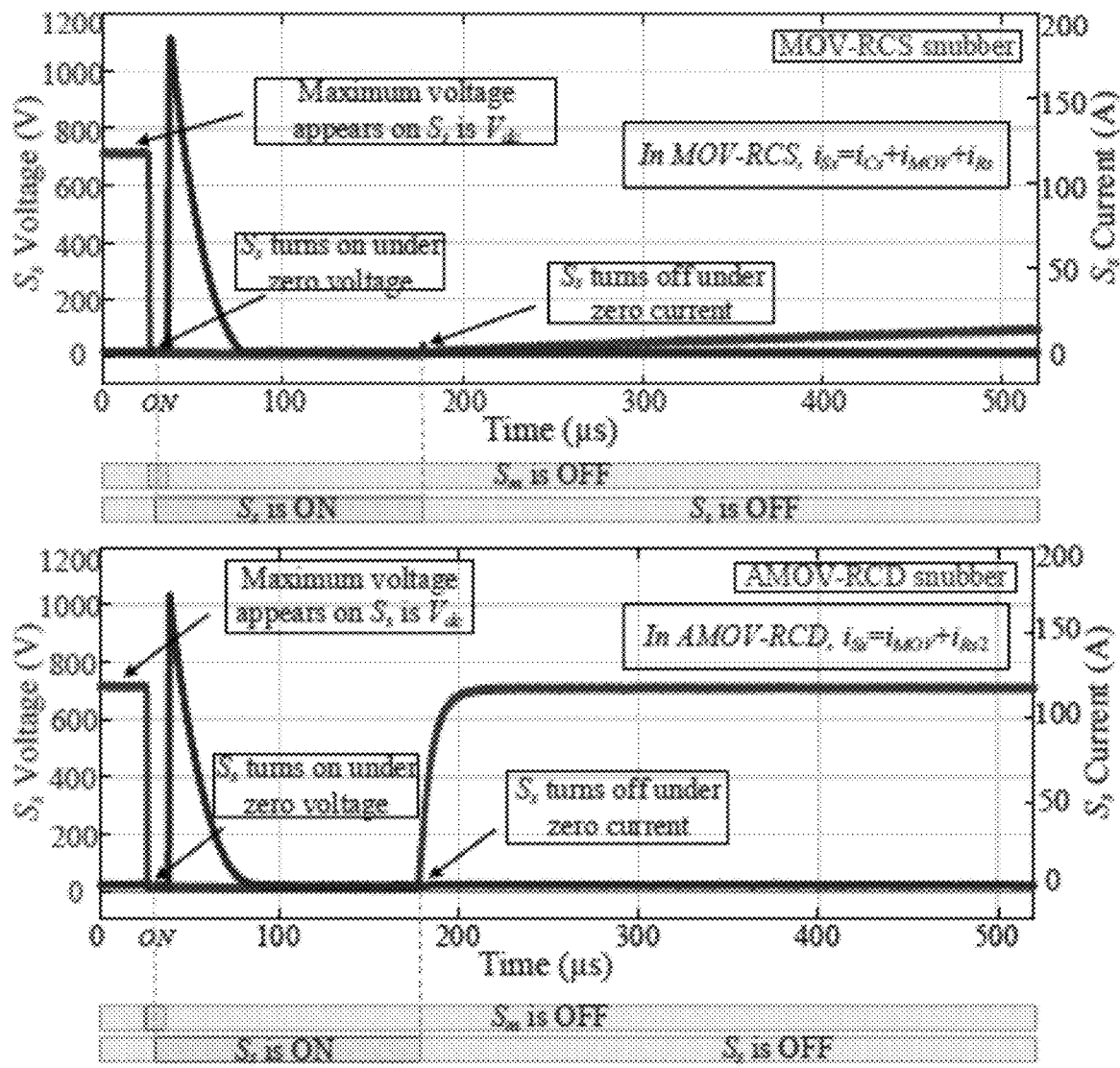
FIG. 37 shows experimental results: Ss voltage and current in MOVRCS and AMOV-RCS snubbers under Vdc=720 V. Results show the safe operation of Ss as it turns on under zero voltage and turns off under zero current.

FIG. 37 shows Ss voltage and current waveforms of the MOVRCS and AMOV-RCD snubbers when Vdc=720 V. As it is shown in FIG. 37, the voltage on Ss is limited to DC bus voltage, and it holds the voltage when SSCB is OFF, verifying no voltage on MOV.

E. Operation of Active Snubber-Based SSCBs with Zero System Inductance

The effectiveness of the proposed active snubbers in isolating short circuit faults with zero line inductance is evaluated in this section. For the presented active snubber-based SSCBs shown in FIGS. 2 to 5, full-controlled SiC MOSFETs have been used for Sm. This facilitates using ultrafast and efficient fault detection strategies such as de-saturation fault detection circuits and Rogowski switch-current sensors for Sm. In this case, Ss can also be controlled accordingly with respect to the logic illustrated in FIGS. 7 and 9.

E.1. Active Snubber with Full-Controlled Snubber Switches

For the presented active snubbers with full-controlled switches in the snubber branch (referring to FIGS. 2 and 4), the SSCBs react to short circuit faults as soon as the faults are detected. In this case, the response speed of the SSCBs is the same as passive MOV-RCD snubber-based SSCBs. The delays is mostly related to the fault detection methods, and there is no additional delay imposed by the snubber switch.

E.2. Active Snubber with Half-Controlled Snubber Switches

Figure 38:
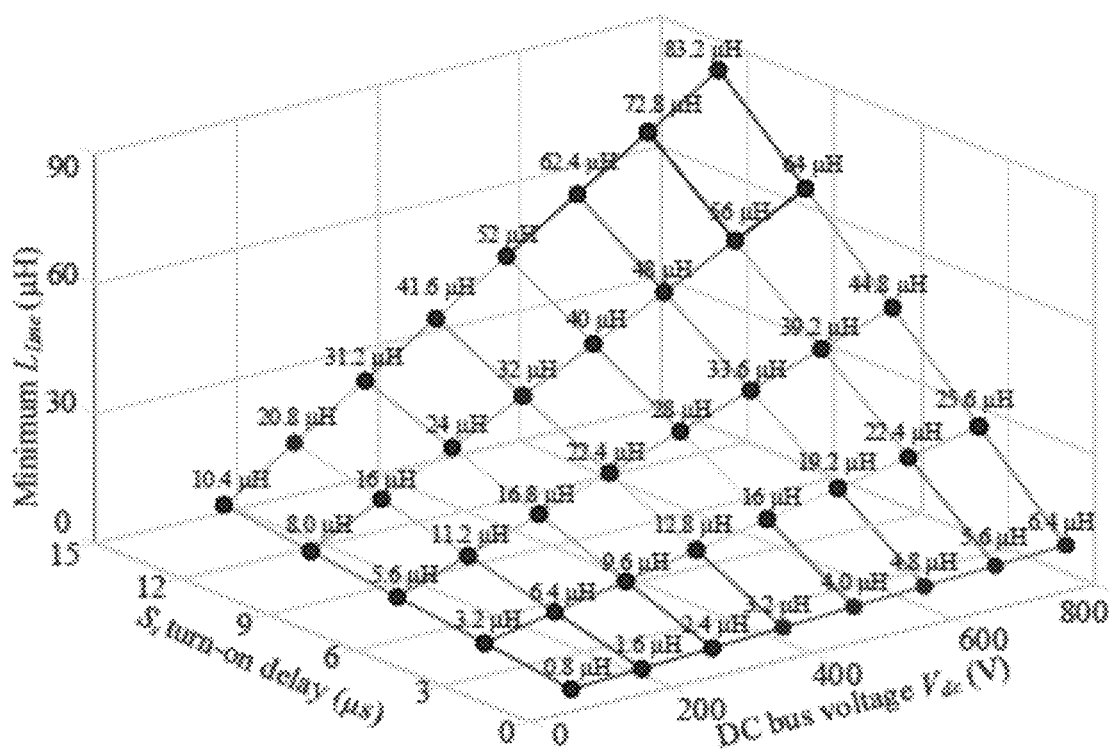
FIG. 38 shows minimum line inductance LLine for different values of DC bus voltage and Ss turn-on delay when active snubbers with half-controlled switches are used; Ith=175 A; Idc,max=300 A.

For active snubbers with half-controlled snubber switches, there is a turn-on delay related to the thyristors. In this case, to have a reliable operation, there should be a minimum line inductance to slow down the rising rate of short circuit fault currents. FIG. 38 graphically shows the minimum required system inductance for different values of DC bus voltage Vdc and turn-on delay of the half-controlled snubber switch tdelay.

E.3. Experimental Results: Short Circuit Isolation with Zero System Inductance

Figure 39:
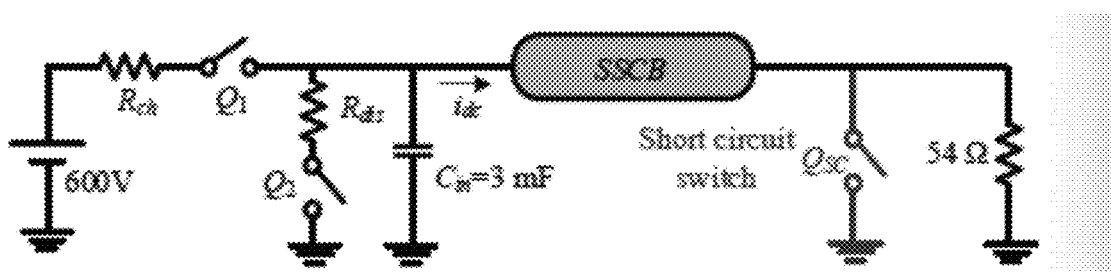
FIG. 39 shows DC test circuit with zero system inductance. AMOVRCD SSCB of FIG. 4(a) is used.
Figure 40:
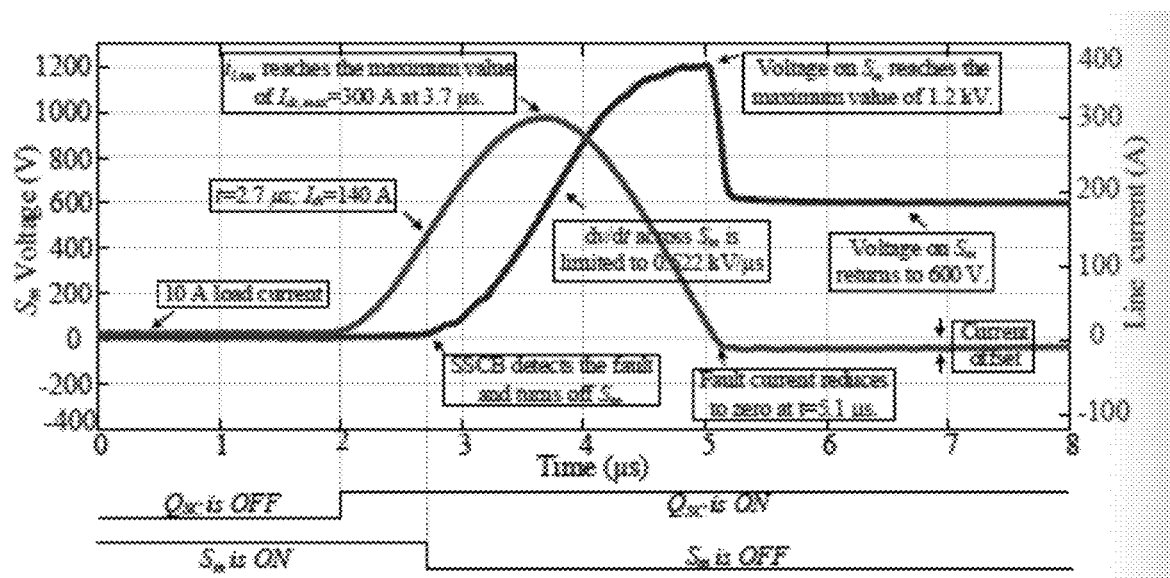
FIG. 40 shows experimental results: Sm voltage vSm and line current iLine are shown under a short circuit fault with zero system line inductance LLine=0. AMOV-RCD SSCB of FIG. 4(a) is used.

Regarding SSCB in FIG. 4(*a*) and the DC test circuits in FIG. 39, experiments have been conducted, and the results are shown in FIG. 40. Before t=2 µs, the system is in the normal condition, and the load current is about 10 A. At t=2 µs, the fault switch QSC turns on, and a short circuit is created in the system. The fault current reaches Ith=140 A in 0.7 µs (t=2.7 µs). SSCB reacts to the fault by instantly turning Sm off. Next, the fault current commutates to the snubber branch and charges Cs. The fault current increases from 140 A to 300 A in 1 µs, meaning iLine=300 A at t=3.7 µs. Then, MOV turns on when the voltage on Cs reaches the clamping voltage of MOV. As shown in FIG. 40, vSm is clamped to 1.2 kV, which is safe. FIG. 40 verifies the capability of the proposed active snubbers with full-controlled snubber switches in isolating short circuits when LLine=0.

VII. Conclusion

MOV-RCS and AMOV-RCD active snubbers based SSCBs have been proposed in this paper. Snubber switch can be a full-controlled or a half-controlled, resulting in four new topologies.

In addition to the conventional MOV-RCD based SSCB, MOVRCS and AMOV-RCD based SSCBs have been designed and implemented. Extensive experiments were conducted under different DC bus voltages up to 720 V to validate the proposed structures, where the reaction time of 2.4 us was achieved in interrupting 183 A. Under extending ηv of the main switch from 37.5% to 60%, active snubbers improve efficiency, power density, and reliability in SSCBs. Besides, design cost reduces significantly when multiple switches are connected in series and parallel in the main switch.

While the invention has been described with reference to the embodiments above, a person of ordinary skill in the art would understand that various changes or modifications may be made thereto without departing from the scope of the claims.

We claim:

1. A solid state circuit breaker (SSCB) comprising an active snubber with a metal oxide varistor with a resistor-capacitive-switch (MOV-RCS) comprising:
    a main switch in parallel with a snubber branch
    wherein the snubber branch includes a snubber switch, a snubber capacitor, a snubber resistor, and a snubber metal oxide varistor;
    wherein the snubber capacitor, the snubber resistor, and the snubber metal oxide varistor are connected in parallel;
    wherein the snubber switch is connected in series with the snubber capacitor, snubber resistor, and snubber metal oxide varistor;
    wherein in the event of a fault, the SSCB undergoes three successive intervals comprising detection, reaction, and preparation;
    wherein during the detection interval, the SSCB detects the fault and the main switch opens, allowing current to pass through the snubber branch and closing the snubber switch;
    wherein during the reaction interval, which follows the detection interval, the snubber capacitor charges to a predetermined controlled voltage threshold, wherein the metal oxide varistor absorbs energy absorbed in the snubber capacitor regardless of system inductance;
    wherein during the preparation interval, which follows the reaction interval, the snubber branch switch opens, and the main switch closes, allowing current to again flow through the main switch.

2. The SSCB of claim 1, wherein the snubber switch comprises a metal-oxide-semiconductor field-effect transistor MOSFET in series with a diode.

3. The SSCB of claim 2, wherein the snubber switch controls a voltage across the snubber metal oxide varistor, the snubber capacitor, and the snubber resistor.

4. The SSCB of claim 1, wherein the snubber switch comprises a thyristor in series with a diode.

5. The SSCB of claim 4, wherein the diode prevents reverse recovery current through the thyristor.

6. The SSCB of claim 1, wherein the snubber switch is full-controlled.

7. The SSCB of claim 1, wherein the snubber switch is half-controlled.

* * * * *